US012672263B2

(12) United States Patent
Hayashi

(10) Patent No.: US 12,672,263 B2
(45) Date of Patent: Jun. 30, 2026

(54) MODULE MOUNTING DEVICE AND INFORMATION PROCESSING APPARATUS

(71) Applicant: 1FINITY Inc., Kawasaki (JP)

(72) Inventor: Nobuyuki Hayashi, Yokohama (JP)

(73) Assignee: 1FINITY Inc., Kawasaki (JP)

( * ) Notice: Subject to any disclaimer, the term of this patent is extended or adjusted under 35 U.S.C. 154(b) by 244 days.

(21) Appl. No.: 18/741,923

(22) Filed: Jun. 13, 2024

(65) Prior Publication Data

US 2025/0024646 A1     Jan. 16, 2025

(30) Foreign Application Priority Data

Jul. 13, 2023     (JP) ................................. 2023-115387

(51) Int. Cl.
*H05K 7/20* (2006.01)
*H05K 5/02* (2006.01)
*H05K 7/14* (2006.01)

(52) U.S. Cl.
CPC ....... *H05K 7/20572* (2013.01); *H05K 5/0256* (2013.01); *H05K 7/20145* (2013.01); *H05K 7/1487* (2013.01)

(58) Field of Classification Search
CPC .......... H05K 7/20572; H05K 7/20145; H05K 7/1487; H05K 5/0256; H05K 5/0286–0291; H05K 5/10; H05K 5/30
See application file for complete search history.

(56) References Cited

U.S. PATENT DOCUMENTS

| | | | | |
|---|---|---|---|---|
| 6,151,210 A | * | 11/2000 | Cercioglu | .......... H05K 7/20572 |
| | | | | 165/104.33 |
| 7,239,523 B1 | * | 7/2007 | Collins | ................ H05K 7/1445 |
| | | | | 361/752 |
| 2012/0075803 A1 | | 3/2012 | Kobayashi | |
| 2014/0291111 A1 | * | 10/2014 | Dietz | ................... B65G 41/003 |
| | | | | 194/344 |
| 2017/0339799 A1 | * | 11/2017 | Su | ......................... H05K 7/1489 |
| 2018/0168071 A1 | * | 6/2018 | Edge | ................. H05K 7/20745 |
| 2024/0204324 A1 | * | 6/2024 | Koyama | ............. H01M 50/249 |

FOREIGN PATENT DOCUMENTS

| | | |
|---|---|---|
| JP | H06-29675 A | 2/1994 |
| JP | 2012-069820 A | 4/2012 |
| JP | 2015-015008 A | 1/2015 |

* cited by examiner

*Primary Examiner* — Jacob R Crum
(74) *Attorney, Agent, or Firm* — WHDA, LLP

(57) ABSTRACT

A module mounting device includes a housing, a first panel provided over a front-end-side of the housing and to include first openings in which first and second electronic-modules are insertable, a first front-end-portion of the first electronic-module attached to the first panel while inserted in a first opening, a second panel provided behind the first panel, to include second openings in which the first and second electronic-modules are insertable, and movable between first and second positions behind the first and second panels, respectively, first and second front-end-portions inserted in the second openings in a state where the second panel is located at the first position, the second front-end-portion inserted in a second opening in a state where the second panel is located at the second position, and a third panel provided behind the second panel and movable between third and fourth positions behind the first and third positions, respectively.

13 Claims, 33 Drawing Sheets

FOURTH POSITION

SECOND POSITION

120B

20

20

123B

121B

122B

121B

122B

10B

20F

10B

20F

MODULE MOUNTING DEVICE AND INFORMATION PROCESSING APPARATUS

CROSS-REFERENCE TO RELATED APPLICATION

This application is based upon and claims the benefit of priority of the prior Japanese Patent Application No. 2023-115387, filed on Jul. 13, 2023, the entire contents of which are incorporated herein by reference.

FIELD

Embodiments discussed herein are related to a module mounting device and an information processing apparatus.

BACKGROUND

Heretofore, there has been an information processing apparatus including a rack having an air intake surface and an air discharge surface, a shelf plate provided in the rack, an electronic device mounted on the shelf plate, and an inclined plate provided above the electronic device and inclined while rising from the air intake surface side to the air discharge surface side, the inclined plate having a facing surface facing the electronic device, the facing surface provided with a groove extending from the air intake surface side to the air discharge surface side.

Japanese Laid-open Patent Publication No. 2015-15008 is disclosed as related art.

SUMMARY

According to an aspect of the embodiments, a module mounting device includes a housing configured to house a first electronic module and a second electronic module and include a front end and a rear end, a first panel provided over a front end side of the housing and configured to include first openings in which the first electronic module and the second electronic module are insertable, a front end portion of the first electronic module being attached to the first panel while being inserted in a first opening of the first openings, a second panel provided behind the first panel, configured to include second openings in which the first electronic module and the second electronic module are insertable, and movable between a first position behind the first panel and a second position behind the first position, the front end portion of the first electronic module and a front end portion of the second electronic module being inserted in the second openings in a state where the second panel is located at the first position, the front end portion of the second electronic module being inserted in a second opening of the second openings in a state where the second panel is located at the second position, and a third panel provided behind the second panel and movable between a third position behind the first position and a fourth position behind the third position, wherein one of the front end portion and a rear end portion of the second electronic module is attached to one of the second panel and the third panel, respectively, and wherein, in a state where the second panel is located at the second position and the third panel is located at the fourth position, the second panel is allowed to be shifted to a first side that is one direction in one of an up-down direction and a right-left direction.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A is a diagram illustrating an example of a configuration of a module mounting device 100 in an embodiment;

FIG. 2E is a diagram illustrating an example of a configuration of the panel 120;

Figure 5A:
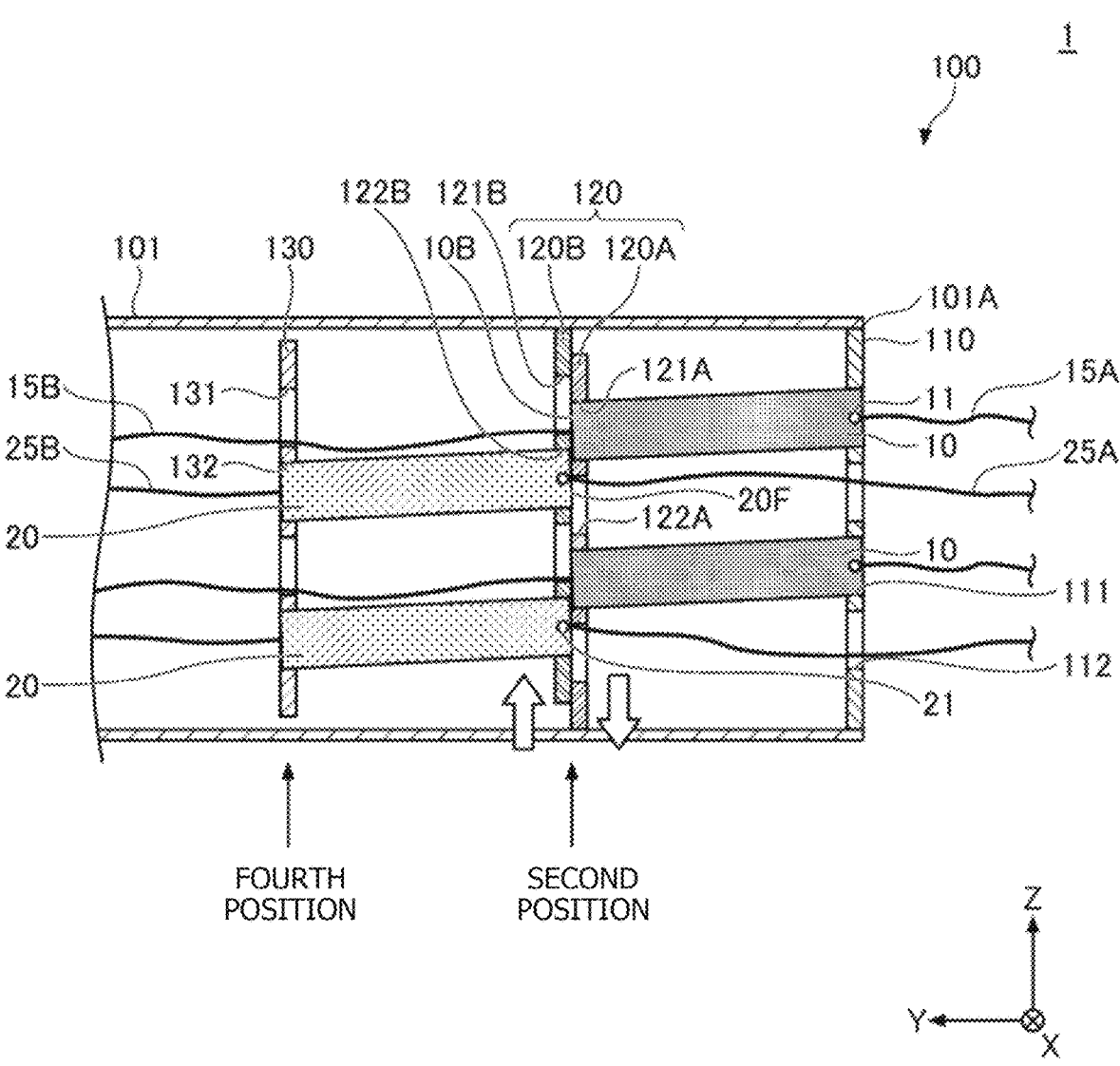
FIG. 5A is a cross-sectional diagram illustrating an example of a configuration of the information processing apparatus 1 in a third mode.
Figure 5B:
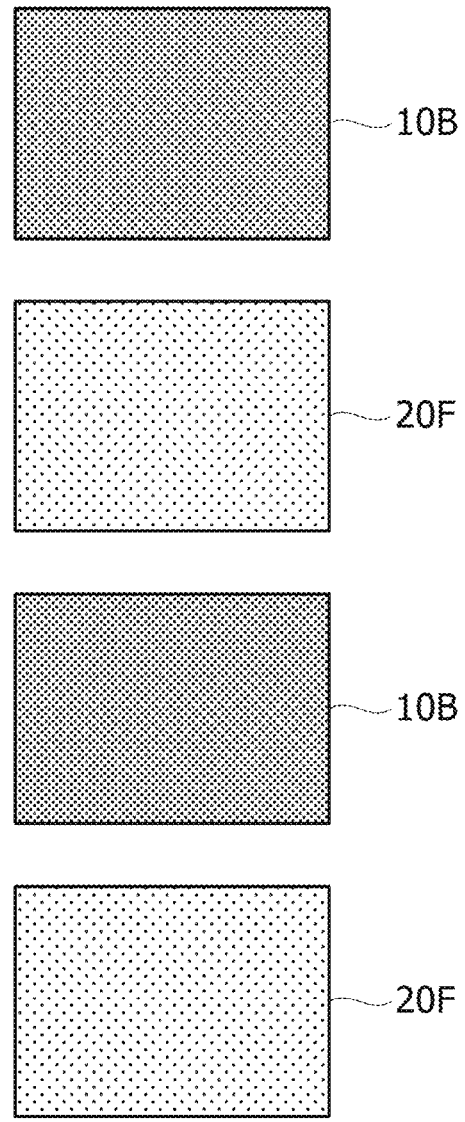
FIG. 5B is a see-through diagram illustrating a positional relationship in front view between rear end surfaces 10B of electronic modules 10 and front end surfaces 20F of electronic modules 20 in the second mode of the information processing apparatus.
Figure 5B:
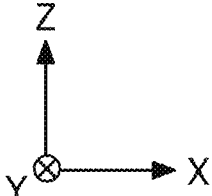
Figure 5C:
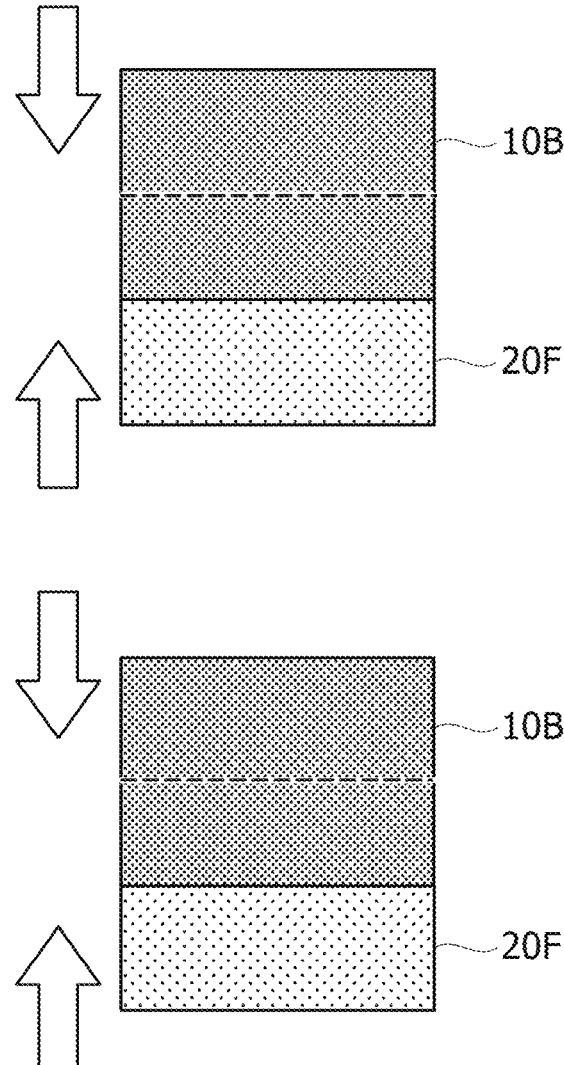
FIG. 5C is a see-through diagram illustrating a positional relationship in front view between the rear end surfaces 10B of the electronic modules 10 and the front end surfaces 20F of the electronic modules 20 in the third mode of the information processing apparatus 1.
Figure 5C:
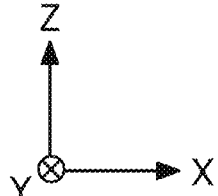
Figure 5D:
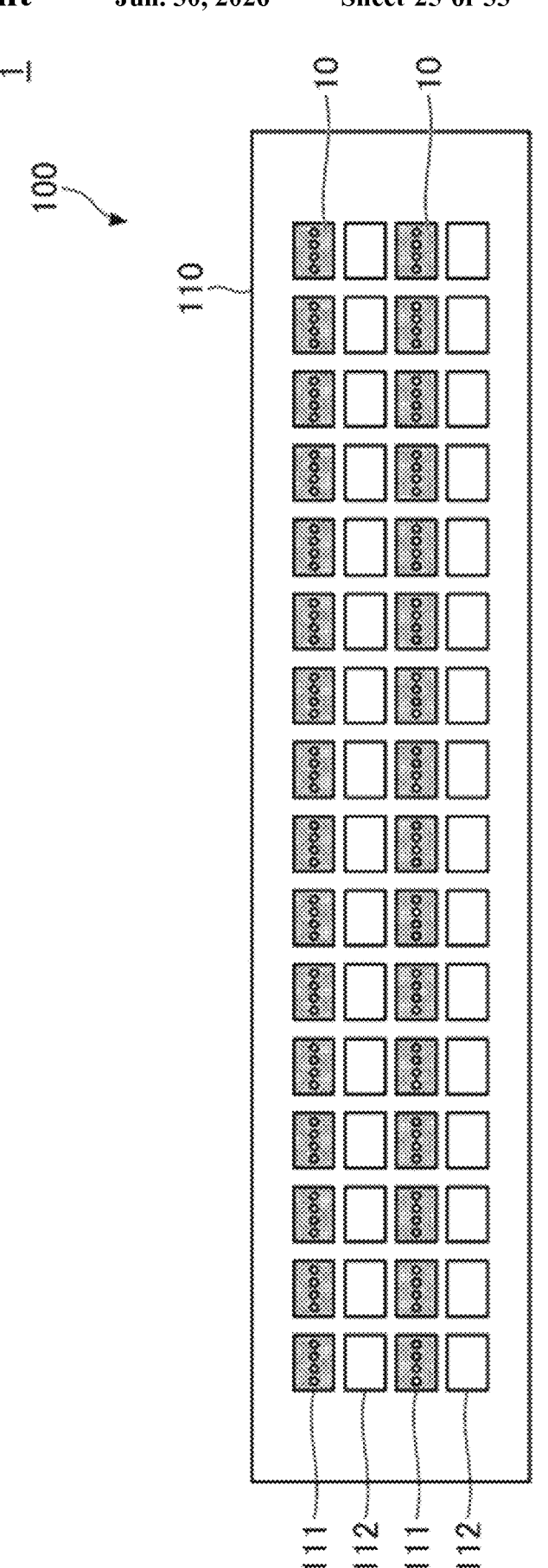
Figure 5D:
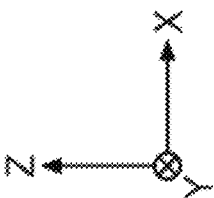
Figure 5E:
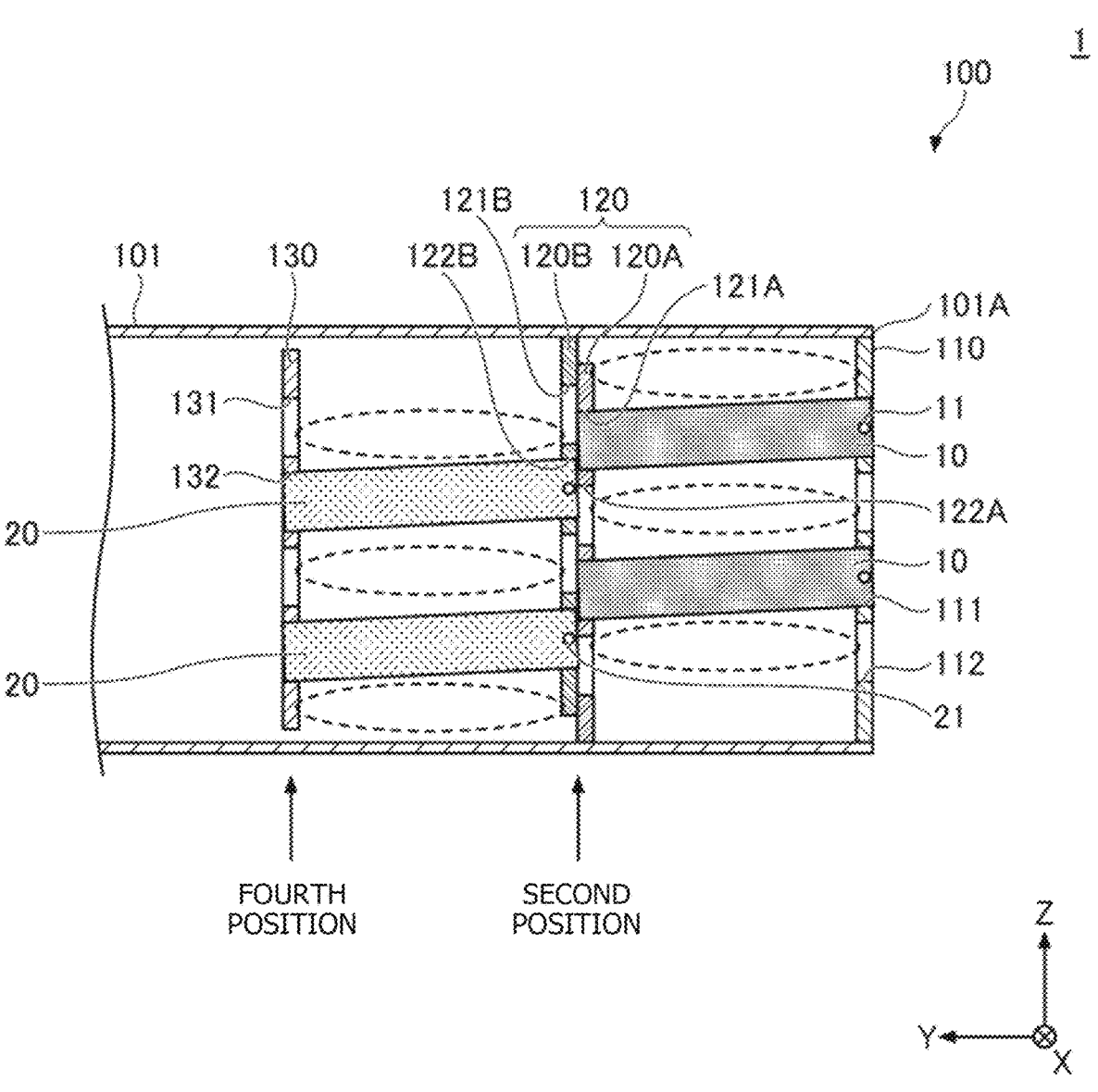
Figure 5F:
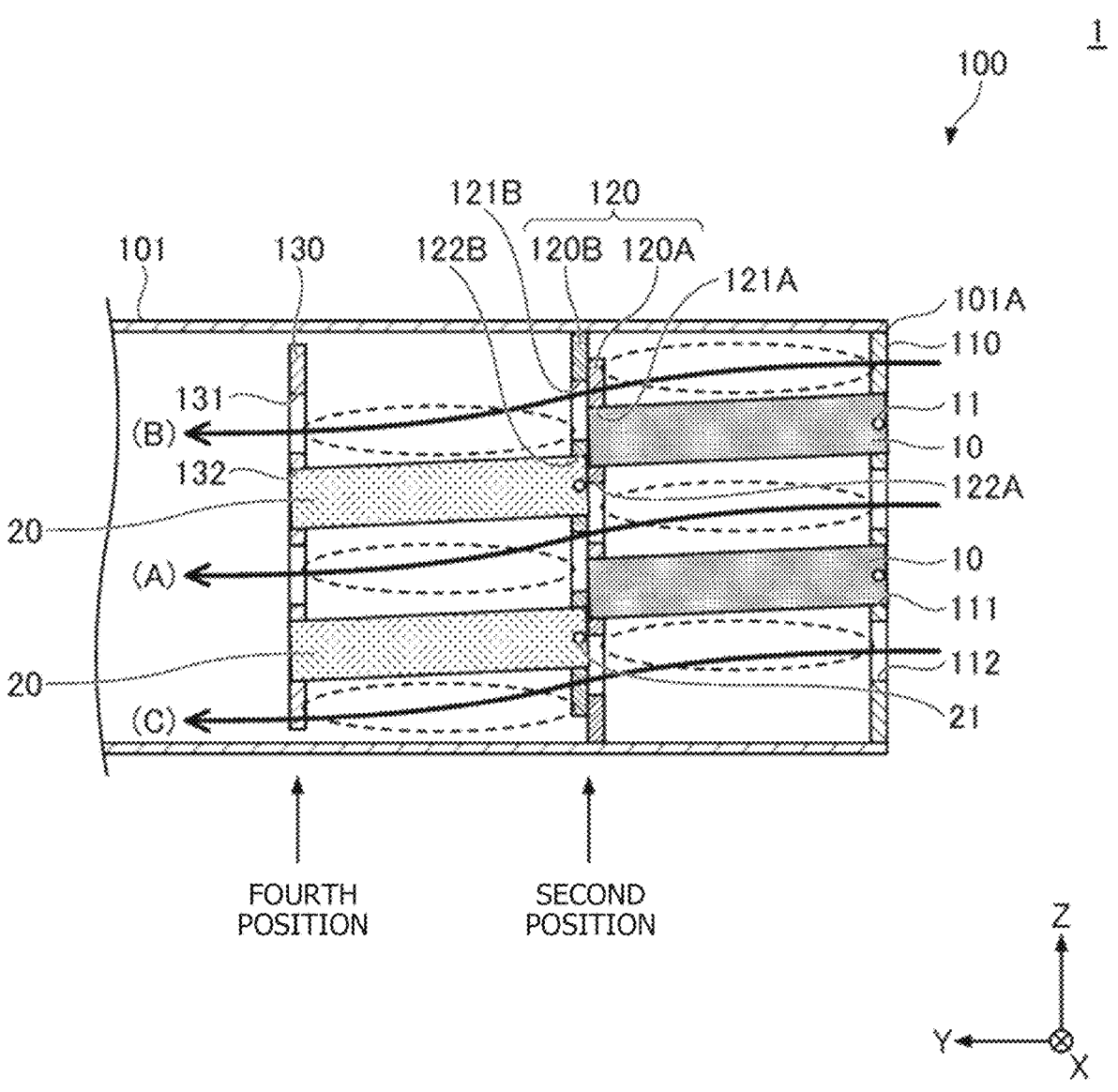
Figure 5G:
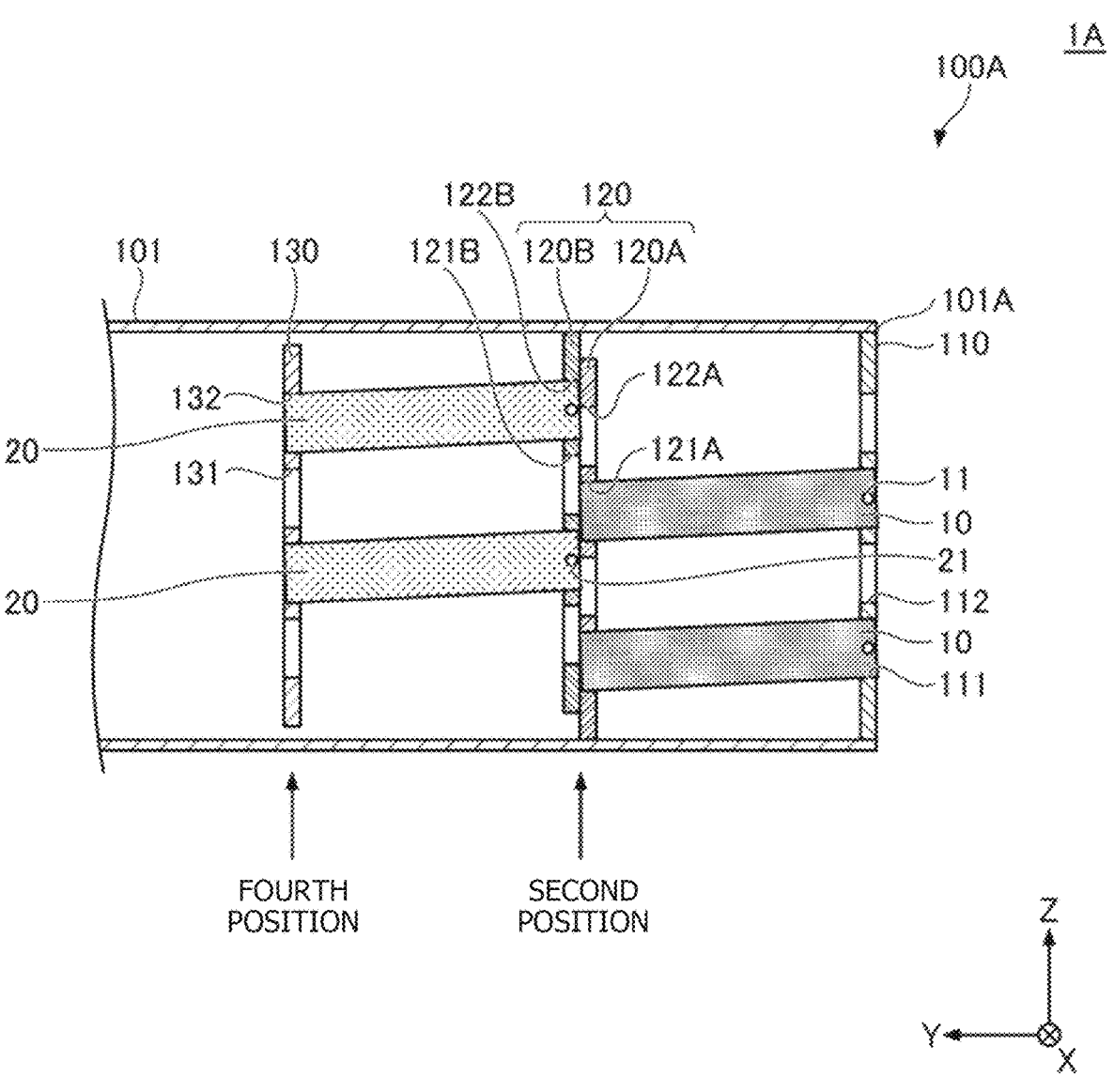
Figure 6A:
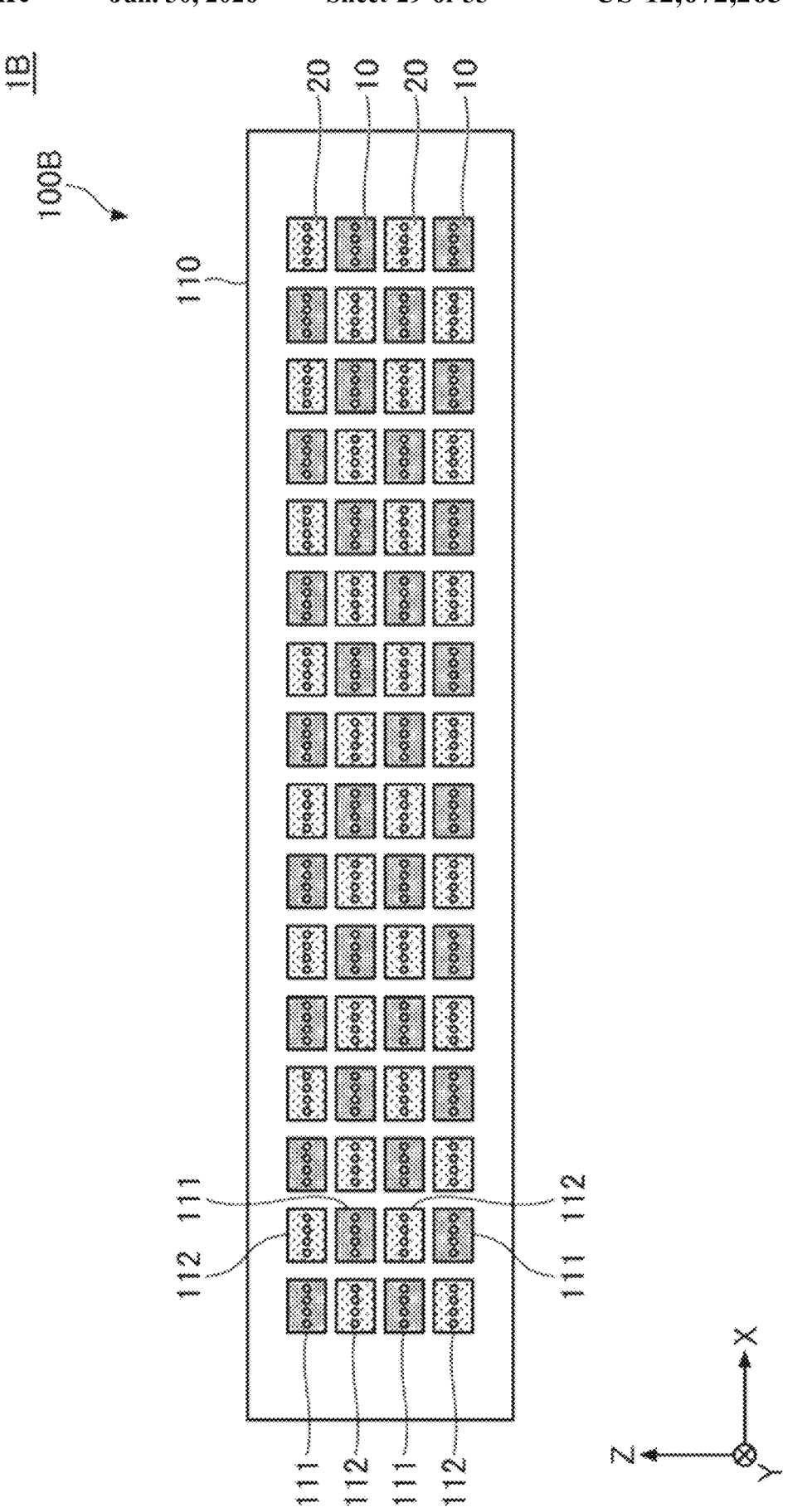
Figure 6B:
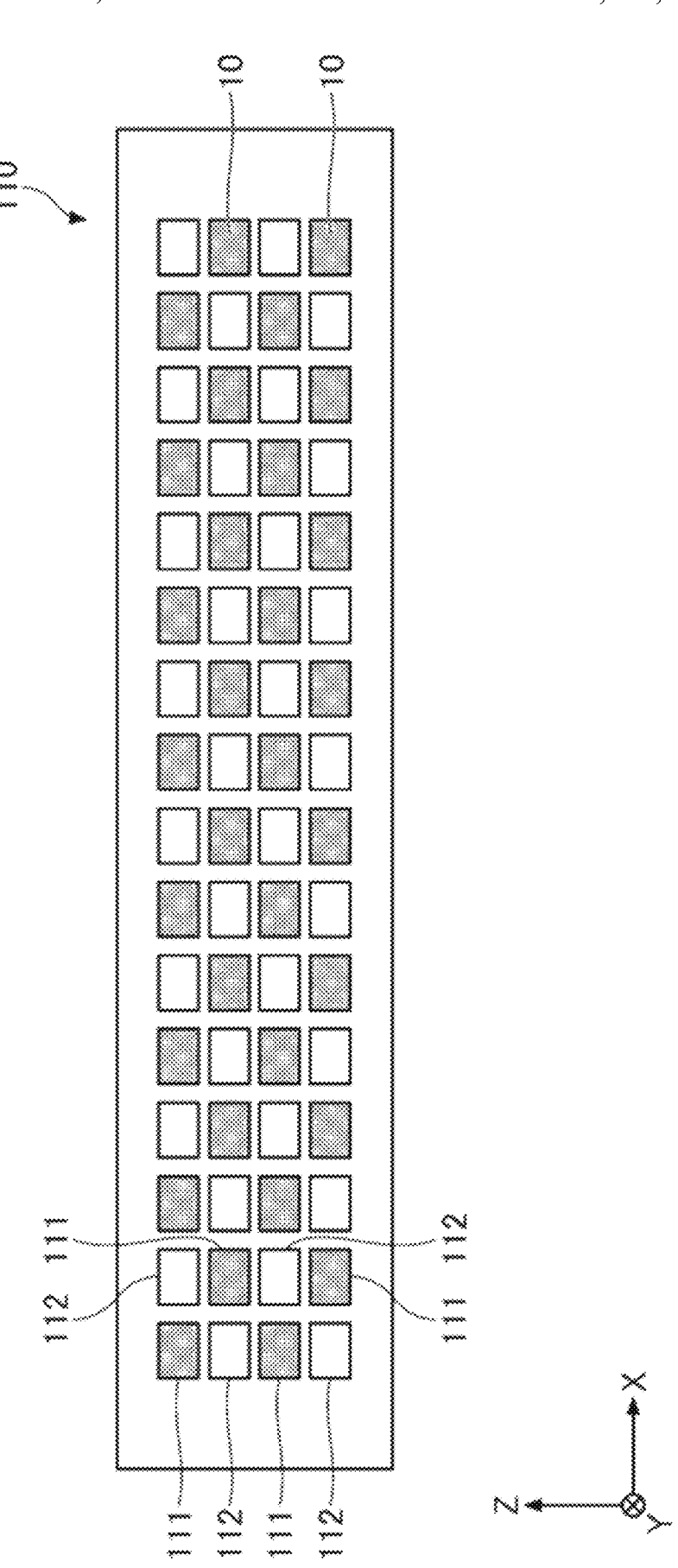
Figure 6C:
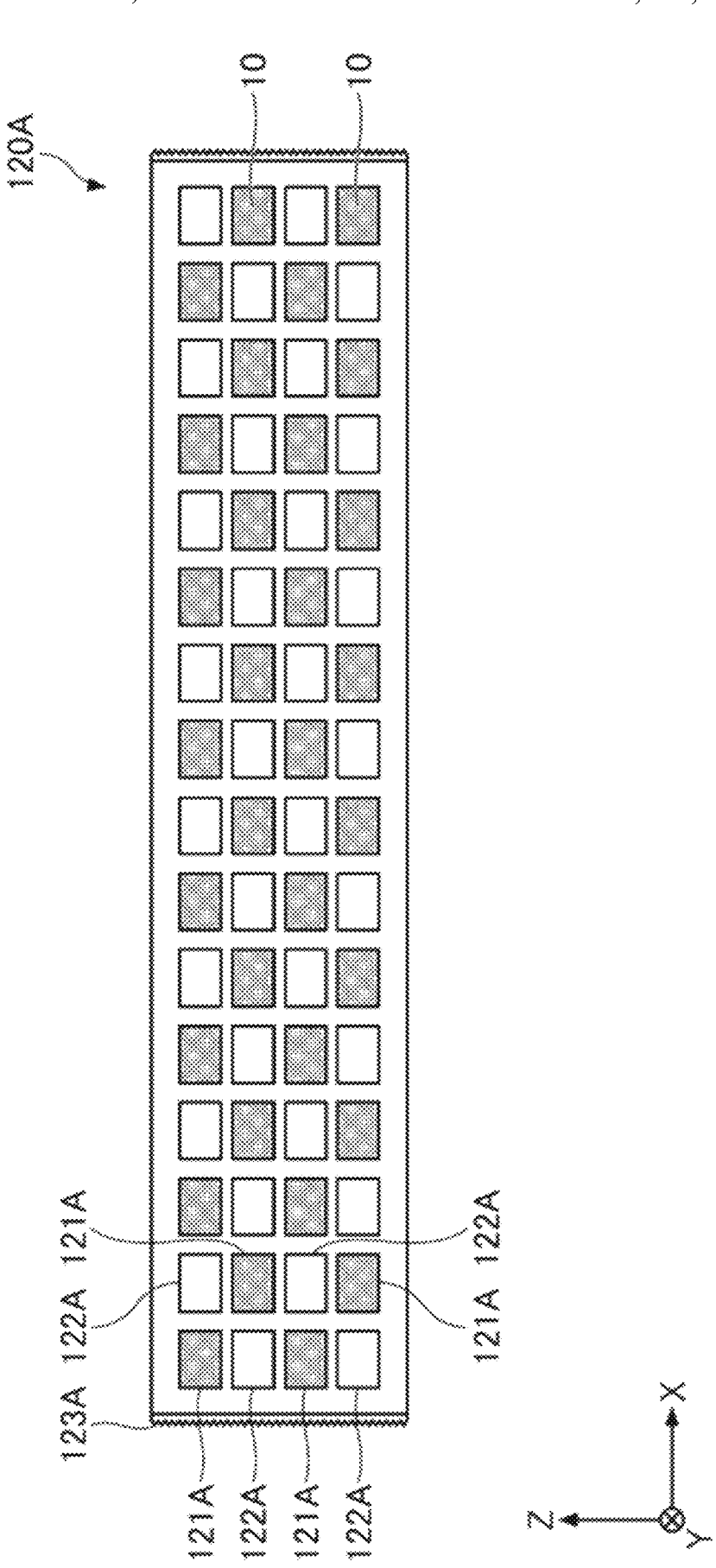
Figure 6D:
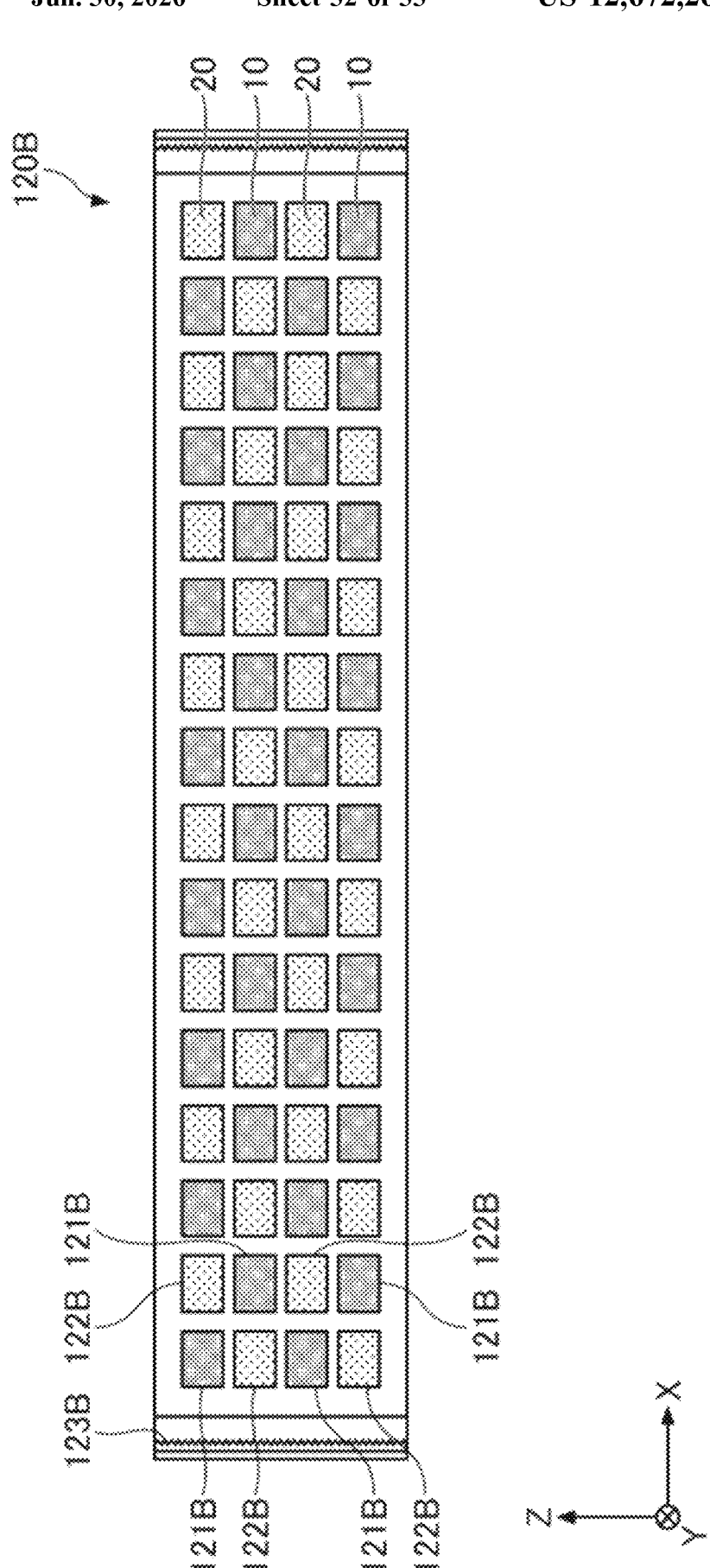
Figure 6E:
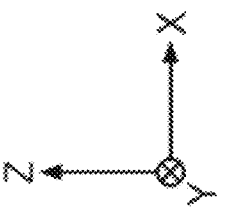

FIG. 5D is a diagram illustrating an example of a front view of a configuration of the information processing apparatus 1 in the third mode;

FIG. 5E is a diagram illustrating an example of spaces around the electronic modules 10 and 20 in a housing 101 in the third mode;

FIG. 5F is a diagram illustrating an example of air flow passages obtained in the housing 101 in the third mode;

FIG. 5G is a diagram illustrating an example of a cross-sectional configuration of an information processing apparatus 1A in the third mode in a first modification of the embodiment;

FIG. 6A is a diagram illustrating an example of a front view of a configuration of an information processing apparatus 1B in the first mode in a second modification of the embodiment;

FIG. 6B is a diagram illustrating an example of a front view of a state of the panel 110 in the first mode of the information processing apparatus 1B;

FIG. 6C is a diagram illustrating an example of a front view of a state of the front panel 120A in the first mode of the information processing apparatus 1B;

FIG. 6D is a diagram illustrating an example of a front view of a state of the rear panel 120B in the first mode of the information processing apparatus 1B; and FIG. 6E is a diagram illustrating an example of a front view of a state of the panel 130 in the first mode of the information processing apparatus 1B.

DESCRIPTION OF EMBODIMENTS

As the performance of information processing apparatuses is improved, the density of electronic devices mounted therein is increased and the amount of heat generated by the electronic devices tends to increase. For this reason, cooling performance is a problem to be solved. However, in order to achieve high density, it may be difficult to provide the inclined plate as in the related art. There is also a demand to reduce power consumption of a cooling device such as a cooling fan while ensuring cooling performance. For example, the problem to be solved is to improve the cooling efficiency.

Hereinafter, embodiments of techniques capable of improving cooling efficiency will be described.

The following description will be given based on an XYZ coordinate system defined as follows. A direction parallel to an X axis (X direction), a direction parallel to a Y axis (Y direction), and a direction parallel to a Z axis (Z direction) are orthogonal to each other. An XY plane is a horizontal plane, a +Z direction is an upward direction, and a −Z direction is a downward direction. A plan view refers to an XY plan view. In the following description, the length, width, thickness, and the like of each constituent element may be illustrated in an exaggerated manner in some cases for easy understanding of configurations.

Embodiments

[Module Mounting Device 100]

Figure 1A:
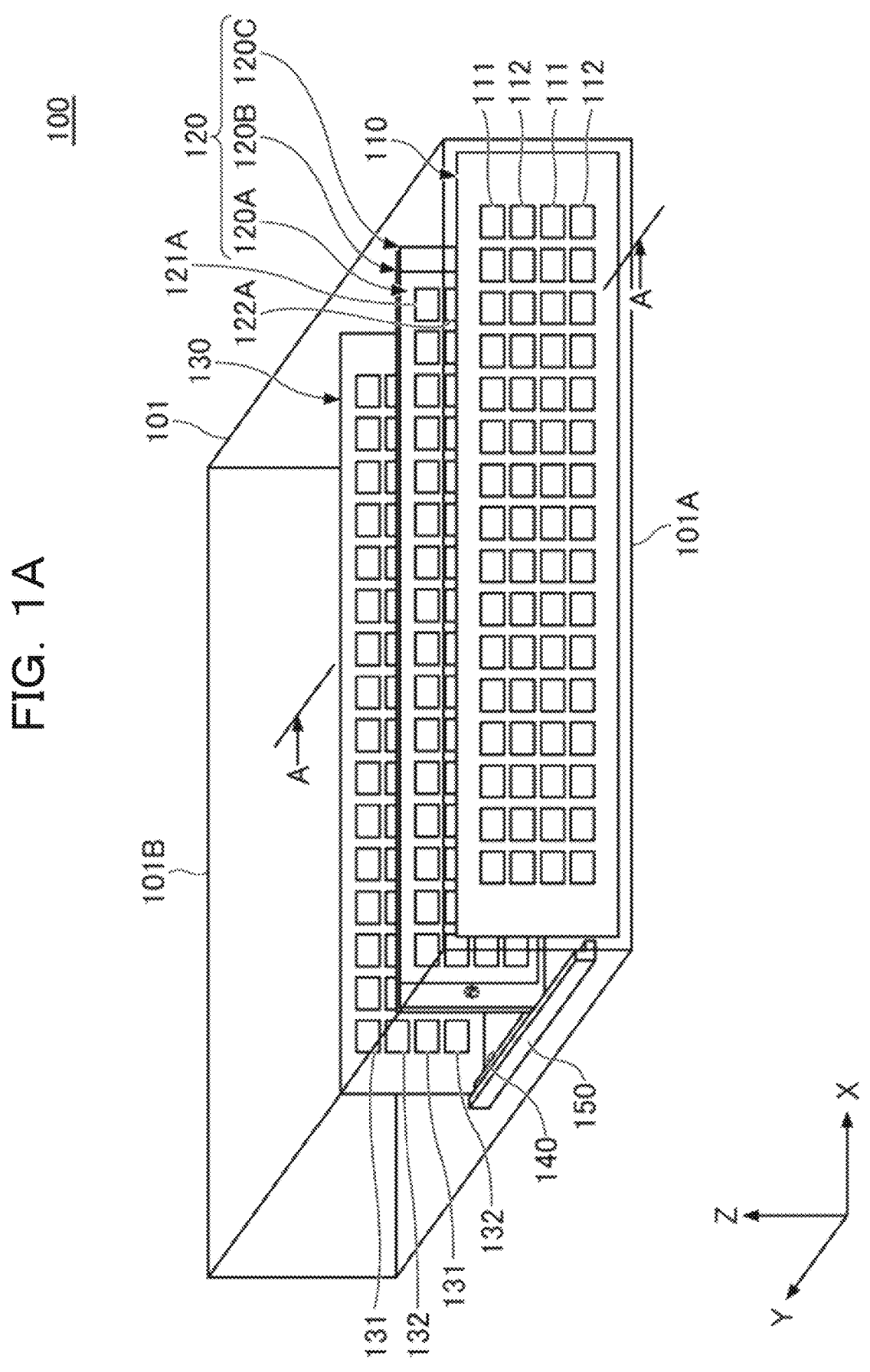

FIG. 1A is a diagram illustrating an example of a configuration of a module mounting device 100 in an embodiment. The module mounting device 100 includes a housing 101, a panel 110, a panel 120, a panel 130, joint members 140, and guide rails 150. The panel 110, the panel 120, and the panel 130 are examples of a first panel, a second panel, and a third panel, respectively. The joint member 140 is an example of a joint member. FIG. 1A is a see-through diagram illustrating the inside of the housing 101.

Figure 1B:
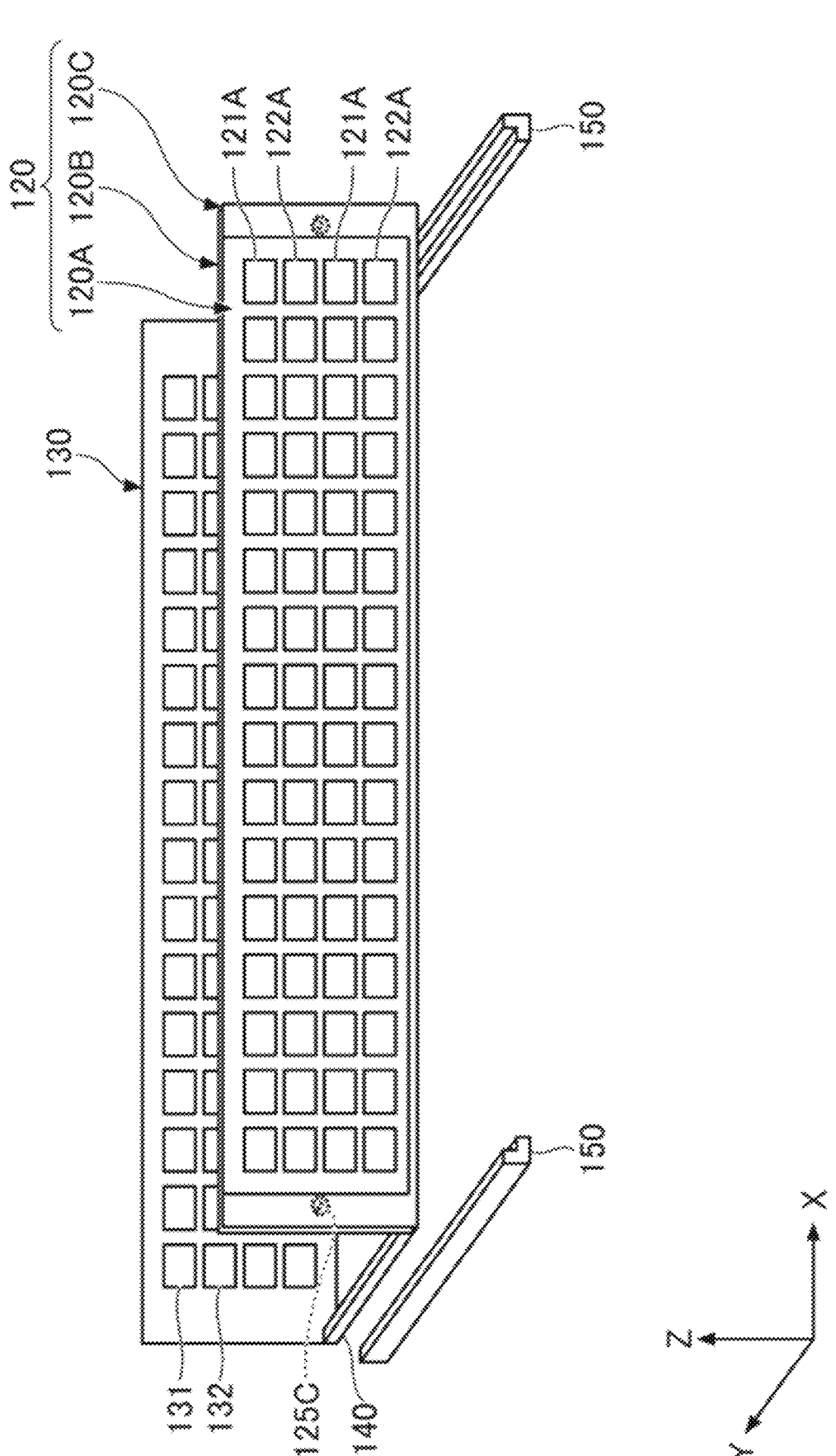
FIG. 1B is a diagram illustrating an example of a configuration of a panel 120, a panel 130, a joint member 140, and a guide rail 150.
Figure 2A:
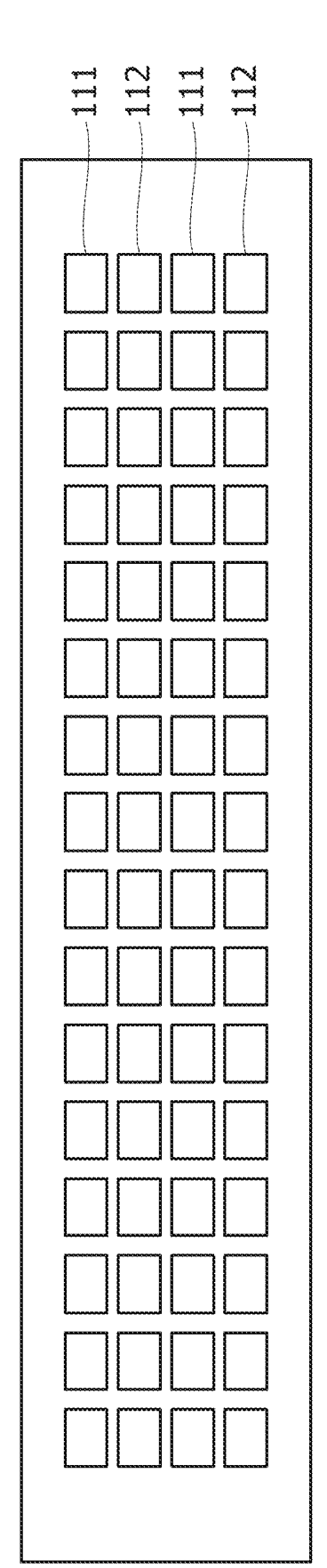
FIG. 2A is a diagram illustrating an example of a configuration of a panel 110.
Figure 2A:
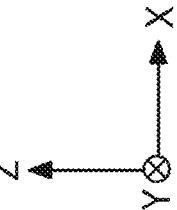
Figure 2B:
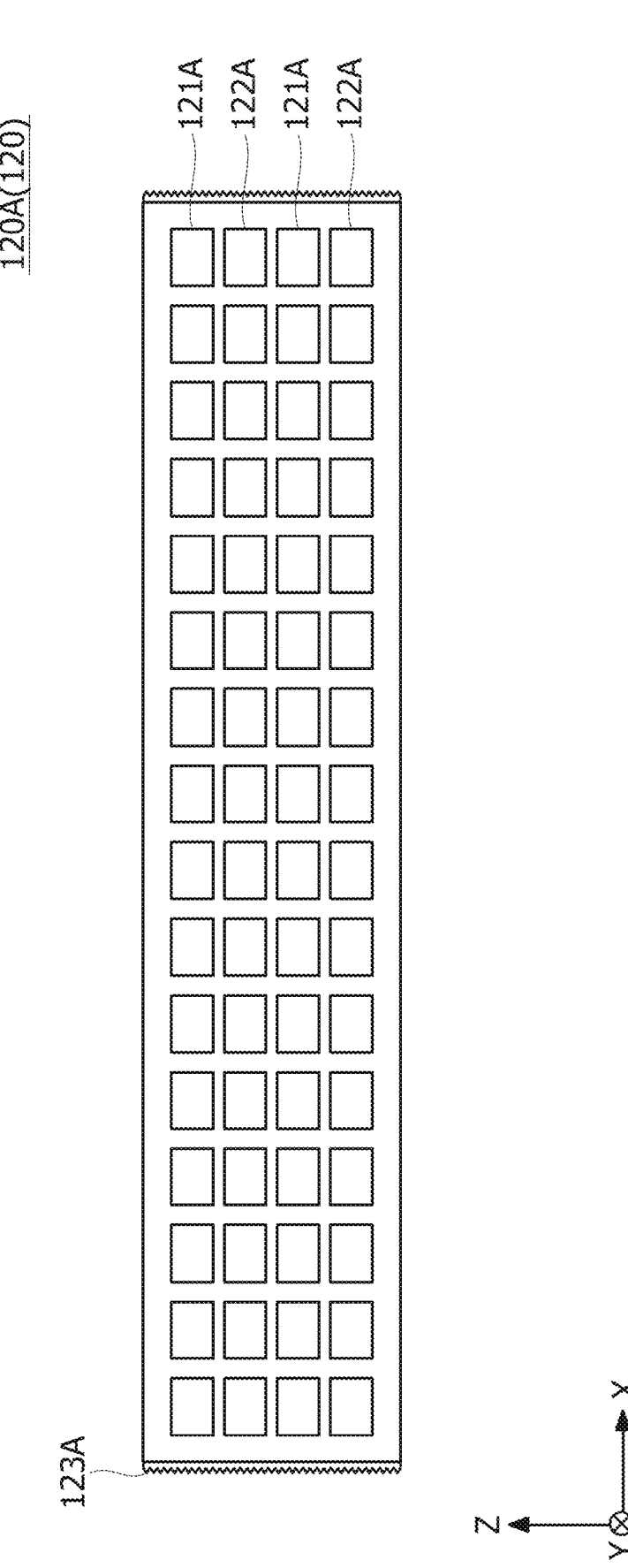
FIG. 2B is a diagram illustrating an example of a configuration of a front panel 120A.
Figure 2C:
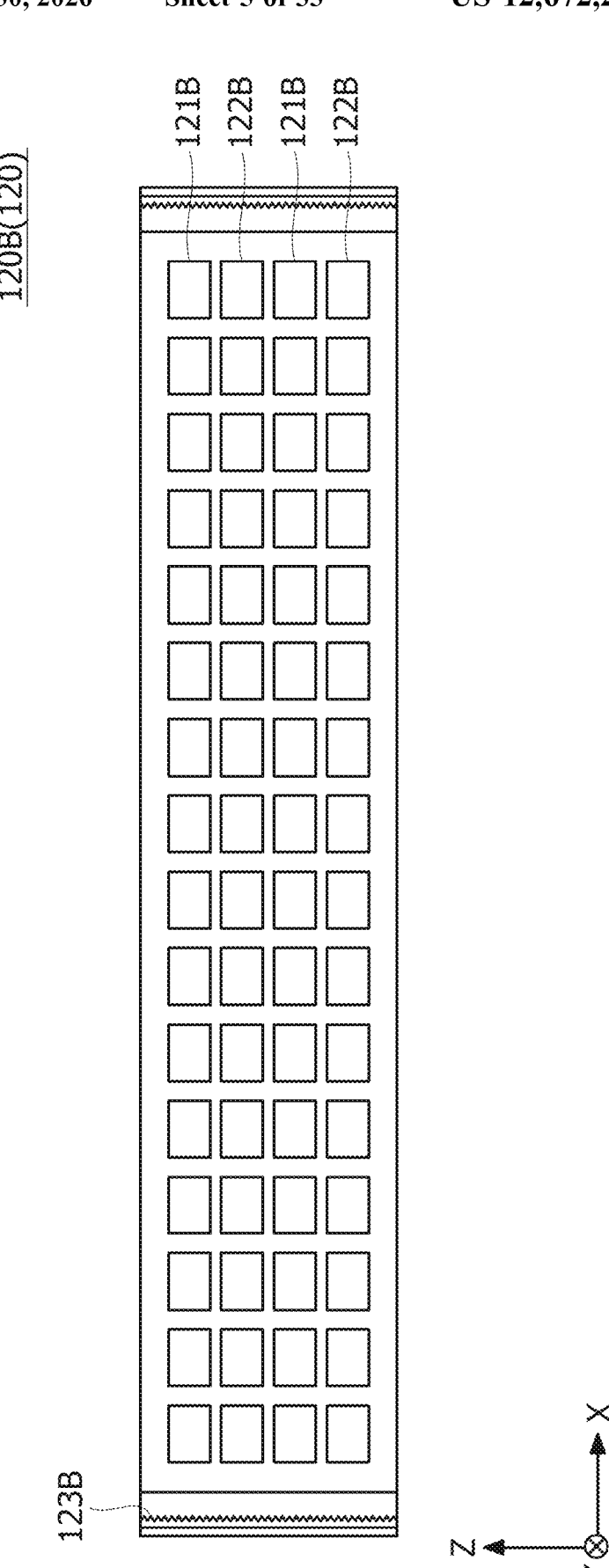
FIG. 2C is a diagram illustrating an example of a configuration of a rear panel 120B.
Figure 2D:
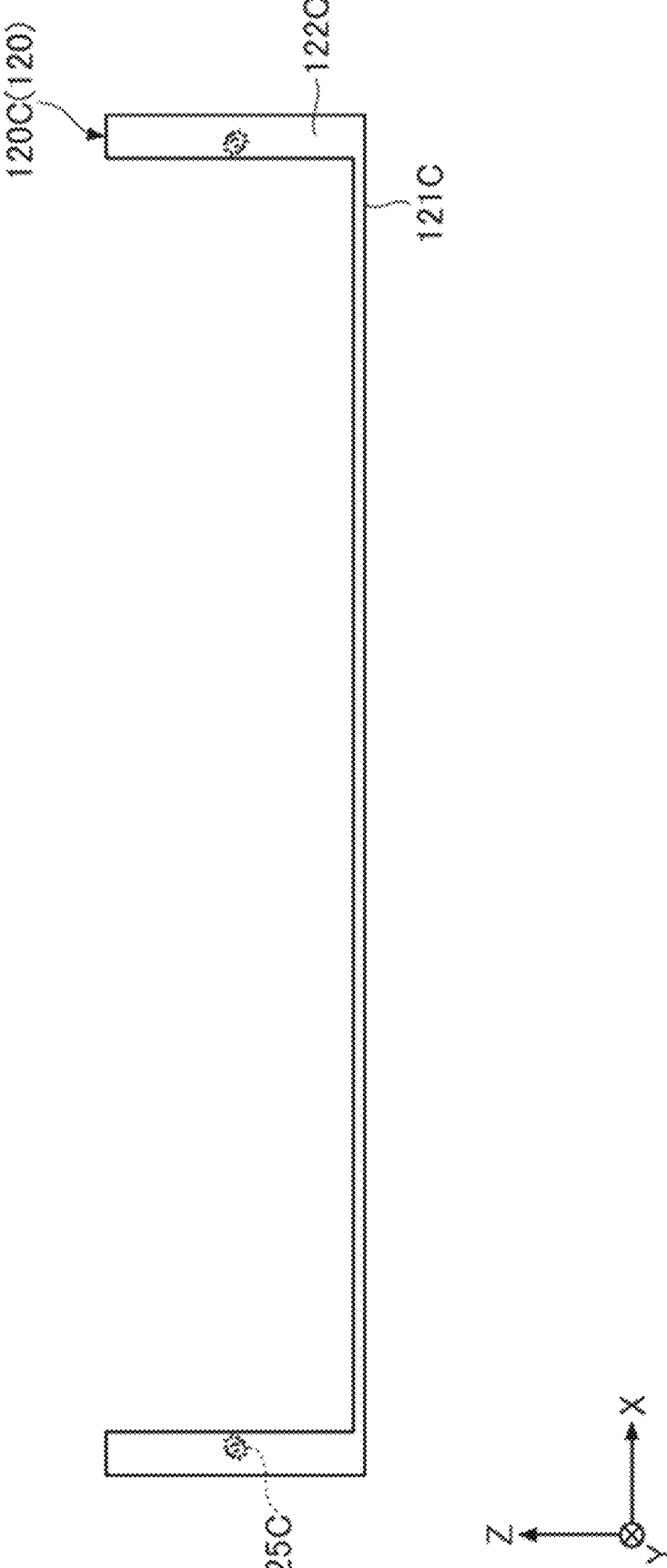
FIG. 2D is a diagram illustrating an example of a configuration of a frame 120C.
Figure 2E:
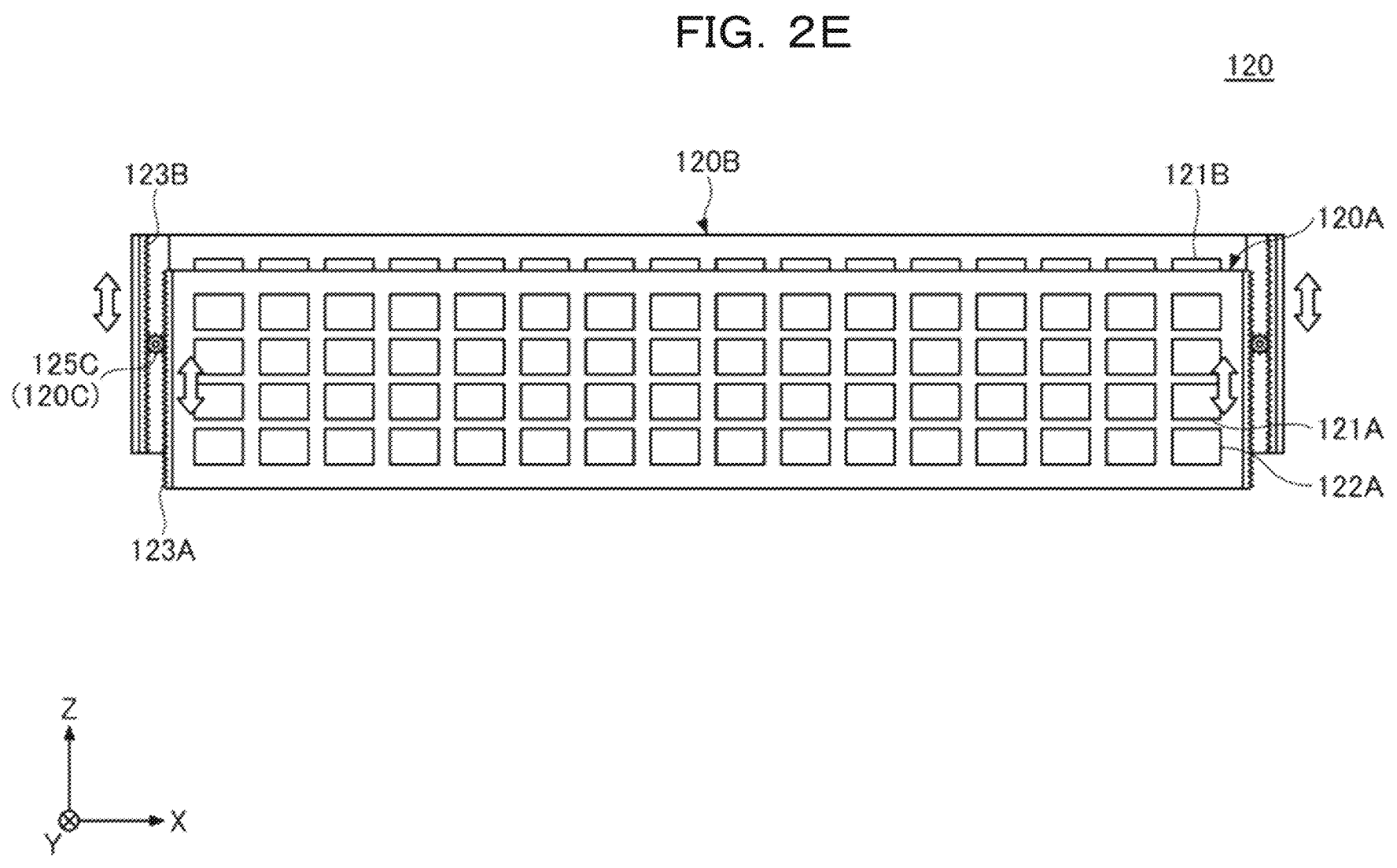
Figure 2F:
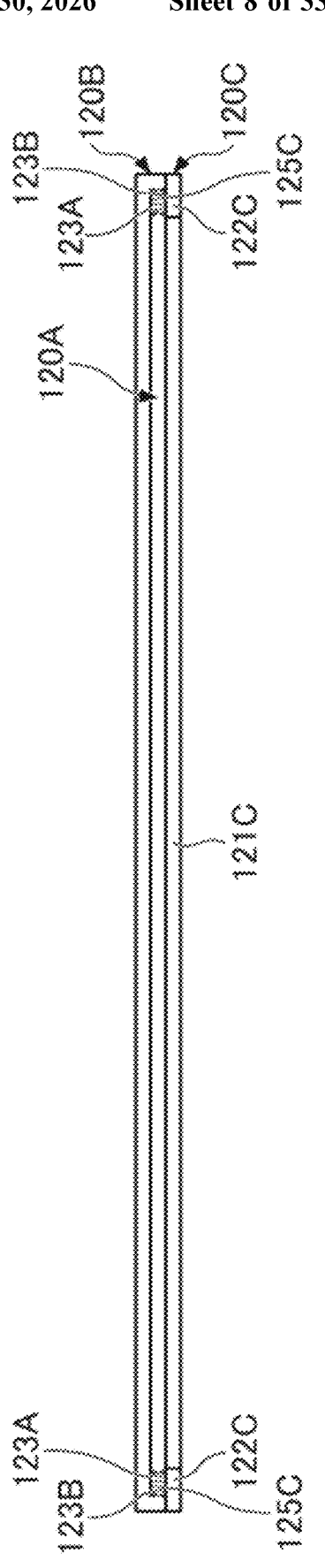
FIG. 2F is a diagram illustrating the example of the configuration of the panel 120.
Figure 2F:
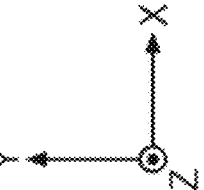
Figure 2G:
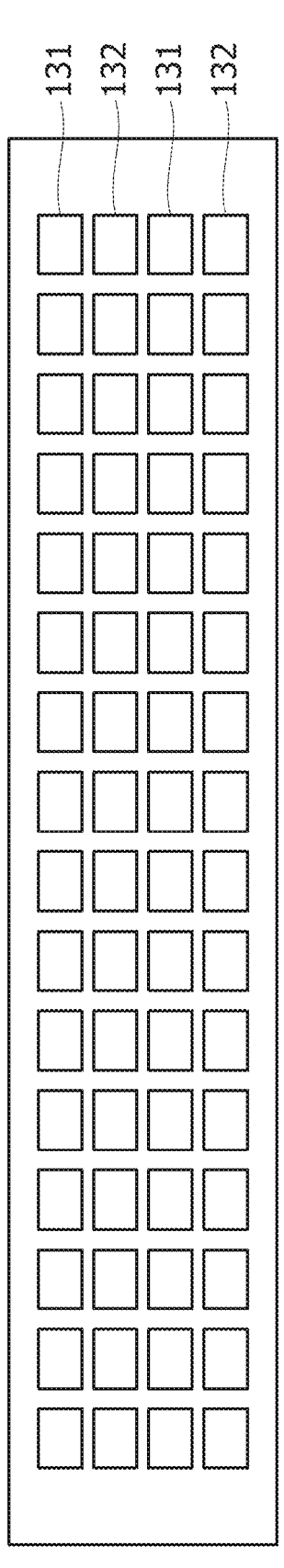
FIG. 2G is a diagram illustrating an example of a configuration of the panel 130.
Figure 2G:
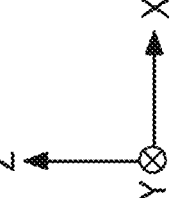

An example of a configuration of the module mounting device 100 will be described with reference to FIGS. 1B and 2A to 2G in addition to FIG. 1A. FIG. 1B is a diagram illustrating an example of a configuration of the panel 120, the panel 130, the joint members 140, and the guide rails 150. FIG. 2A is a diagram illustrating an example of a configuration of the panel 110. FIG. 2B is a diagram illustrating an example of a configuration of a front panel 120A. FIG. 2C is a diagram illustrating an example of a configuration of a rear panel 120B. FIG. 2D is a diagram illustrating an example of a configuration of a frame 120C. FIGS. 2E and 2F are diagrams illustrating an example of a configuration of the panel 120. FIG. 2G is a diagram illustrating an example of a configuration of the panel 130. FIG. 2E only illustrates gears 125C in the frame 120C while a base portion 121C and support portions 122C in the frame 120C are omitted. In FIGS. 1A to 2G except for FIG. 2F, the housing 101, the panel 110, the panel 120, and the panel 130 are illustrated as planes with their thicknesses omitted for easy understanding of the configurations.

The module mounting device 100 is a rack-type device for mounting multiple electronic modules thereon. As an example, the electronic module may be an optical module that converts an optical signal transmitted from an optical fiber into an electric signal by photoelectric conversion. The electronic module may be an optical-optical relay adapter that relays optical signals transmitted from an optical fiber. In this case, the information processing apparatus in the embodiment including the electronic modules and the module mounting device 100 is an apparatus that performs signal processing and transmits the signals. As an example, the electronic module may be a server. In this case, the information processing apparatus including the electronic modules and the module mounting device 100 is a rack server. The electronic module may be a module other than those described above. The module mounting device 100 has a configuration in which multiple electronic modules are easily replaceable.

As the data volume or the like increases, the electronic modules as optical modules, servers, or the like are mounted at a higher density and tend to generate a larger amount of heat. For this reason, it is desirable to ensure sufficient cooling performance. It is also desired to reduce power consumption of a cooling device such as a cooling fan while ensuring the cooling performance. From such a viewpoint, the module mounting device 100 has a configuration capable of efficiently cooling the multiple electronic modules. Hereinafter, an example of the configuration of the module mounting device 100 will be described.

In the module mounting device 100, a side where the panel 110 is located (a −Y direction-side) is a front side or a front surface side, and a +Y direction-side is a rear side or a rear surface side. The front side where the panel 110 is located is a side from which electronic modules are to be inserted into the module mounting device 100. Instead, electronic modules may be inserted into the module mounting device 100 from the rear side. In the following description, a front view will refer to a view in which the module mounting device 100 is seen from the front surface side. Here, the front view is synonymous with a front side view.

[Housing 101]

The housing 101 houses multiple electronic modules. The housing 101 includes ±X direction-side walls and ±Z direction-side walls. In the housing 101, the front surface side is provided with the panel 110, and the rear surface side is opened as an example. In the housing 101, a −Y direction-side end is a front end 101A and a +Y direction-side end is a rear end 101B.

The housing 101 just has to be able to house multiple electronic modules in a space surrounded by the ±X direction-side walls, the ±Z direction-side walls, and the panel 110. Each of the ±X direction-side walls and the ±Z direction-side walls of the housing 101 may have a structure such as a mesh structure with a large number of holes or a structure provided with a large number of holes by punching processing. The ±X direction-side walls and the ±Z direction-side walls of the housing 101 may be walls having no holes. The rear surface side of the housing 101 may be provided with a wall similar to the ±X direction-side walls and the ±Z direction-side walls.

[Panel 110]

As illustrated in FIG. 1A, the panel 110 is a front panel provided on the front surface side of the housing 101 and is fixed to the front end 101A of the housing 101. The panel 110 is a plate-shaped member having a rectangular shape in front view. A longitudinal direction of the panel 110 is the X direction. The panel 110 may be a part of the housing 101, or may be provided separately from the housing 101 and fixed to the housing 101.

As illustrated in FIG. 2A, the panel 110 is the flat plate-shaped member having rectangular openings 111 and 112. The openings 111 and 112 are an example of first openings. Two openings 111 and two openings 112 are aligned in the up-down direction, and the openings 111, 112, 111, and 112 are arranged in this order from top to bottom. Multiple openings 111 and 112 are aligned in the X direction. As an example, 16 openings 111 and 16 openings 112 are aligned in the X direction. For example, the openings 111 and 112 are arranged in a matrix of 4 rows×16 columns in front view of the panel 110. Each of the openings 111 and 112 is not limited to a rectangular opening but may be, for example, a circular opening, an elliptic opening, or the like.

As an example, the openings 111 and 112 have an equal opening size which allows an electronic module to pass through. Electronic modules disposed inside the housing 101 through the openings 111 are fixed to the panel 110, but electronic modules disposed inside the housing 101 through the openings 112 are not fixed to the panel 110. The electronic modules disposed inside the housing 101 through the openings 111 and the electronic modules disposed inside the housing 101 through the openings 112 are located at different positions in the Y direction when the panels 120 and 130 are moved rearward. Details thereof will be described later.

For example, when the electronic modules disposed inside the housing 101 through the openings 111 are different in size from the electronic modules disposed inside the housing 101 through the openings 112, the openings 111 and 112 may be different in opening size.

As an example, the portion of the panel 110 other than the openings 111 and 112 may have a structure such as a mesh structure with a large number of holes or a structure provided with a large number of holes by punching processing. The portion of the panel 110 other than the openings 111 and 112 may be a wall having no holes.

[Panel 120]

As mainly illustrated in FIGS. 1A, 1B, and 2B to 2F, the panel 120 includes the front panel 120A, the rear panel 120B, and the frame 120C. The front panel 120A is an example of a second front panel. The rear panel 120B is an example of a second rear panel. The front panel 120A and the rear panel 120B are held by the frame 120C.

[Front Panel 120A]

As illustrated in FIG. 1A, the front panel 120A is provided inside the housing 101. The front panel 120A is a plate-shaped member having a rectangular shape in front view. A longitudinal direction of the front panel 120A is the X direction. The front panel 120A includes rectangular openings 121A and 122A and teeth portions 123A. The openings 121A and 122A are an example of second openings and an example of second front openings. The teeth portions 123A are an example of first teeth portions. Each of the openings 121A and 122A is not limited to a rectangular opening but may be, for example, a circular opening, an elliptic opening, or the like.

Two openings 121A and two openings 122A are aligned in the up-down direction, and the openings 121A, 122A, 121A, and 122A are arranged in this order from top to bottom. Multiple openings 121A and 122A are aligned in the X direction. As an example, 16 openings 111 and 16 openings 112 are aligned in the X direction.

The opening size of the openings 121A is equal to the opening size of the openings 111. Similarly, the opening size of the openings 122A is equal to the opening size of the openings 112. Since the opening sizes of the openings 111 and 112 herein are equal to each other as an example, the opening sizes of the openings 121A and 122A are equal to each other as an example.

A layout of the 16 openings 121A and the 16 openings 122A is equal to a layout of the 16 openings 111 and the 16 openings 112. For example, the interval between the openings 121A adjacent to each other in the X direction and the interval between the openings 122A adjacent to each other in the X direction are equal to the interval between the openings 111 adjacent to each other in the X direction and the interval between the openings 112 adjacent to each other in the X direction. The interval between the openings 121A and 122A adjacent to each other in the Y direction is equal to the interval between the openings 111 and 112 adjacent to each other in the Y direction.

In a state where the heights of the front panel 120A and the panel 110 are aligned with each other, the positions of the openings 111 and 121A coincide with each other and the positions of the openings 112 and 122A coincide with each other in front view.

The teeth portions 123A each serving as a rack of a rack-and-pinion are provided at both ends of the front panel 120A in the X direction. Each teeth portion 123A has multiple teeth formed along the Z direction. The teeth of each teeth portion 123A are engaged with a gear 125C together with the corresponding teeth portion 123B of the rear panel 120B. The teeth portion 123A on the −X direction side has the teeth facing the −X direction side, and the teeth portion 123A on the +X direction side has the teeth facing the +X direction side. For example, the teeth of the two teeth portions 123A face outward in the X direction of the front panel 120A. A configuration of the teeth portions 123A will be described later together with configurations of the teeth portions 123B of the rear panel 120B and the gear 125C of the frame 120C.

As an example, the portion of the front panel 120A excluding the openings 121A and 122A and the teeth portions 123A may have a structure such as a mesh structure with a large number of holes or a structure provided with a large number of holes by punching processing. The portion of the front panel 120A excluding the openings 121A and 122A and the teeth portions 123A may be a wall having no holes.

[Rear Panel 120B]

As illustrated in FIG. 1A, the rear panel 120B is provided behind the front panel 120A in the housing 101. The rear panel 120B is a plate-shaped member having a rectangular shape in front view. A longitudinal direction of the rear panel 120B is the X direction. Regarding the size of the rear panel 120B in front view, for example, the length in the X direction is longer than that of the front panel 120A and the height in the Z direction is equal to that of the front panel 120A. The rear panel 120B includes rectangular openings 121B and 122B and the teeth portions 123B. The openings 121B and 122B are an example of second openings and an example of second rear openings. The teeth portions 123B are an example of second teeth portions. Each of the openings 121B and 122B is not limited to a rectangular opening but may be, for example, a circular opening, an elliptic opening, or the like.

Two openings 121B and two openings 122B are aligned in the up-down direction, and the openings 121B, 122B, 121B, and 122B are arranged in this order from top to bottom. Multiple openings 121B and 122B are aligned in the X direction. As an example, 16 openings 121B and 16 openings 122B are aligned in the X direction.

The opening size of the openings 121B is equal to the opening size of the openings 111. Similarly, the opening size of the openings 122B is equal to the opening size of the openings 112. Since the opening sizes of the openings 111 and 112 herein are equal to each other as an example, the opening sizes of the openings 121B and 122B are equal to each other as an example.

A layout of the 16 openings 121B and the 16 openings 122B is equal to a layout of the 16 openings 121A and the 16 openings 122A. For example, the interval between the openings 121B adjacent to each other in the X direction and the interval between the openings 122B adjacent to each other in the X direction are equal to the interval between the openings 111 adjacent to each other in the X direction and the interval between the openings 112 adjacent to each other in the X direction. The interval between the openings 121B and 122B adjacent to each other in the Y direction is equal to the interval between the openings 111 and 112 adjacent to each other in the Y direction.

For example, the interval between the openings 121B adjacent to each other in the X direction and the interval between the openings 122B adjacent to each other in the X direction are equal to the interval between the openings 121A adjacent to each other in the X direction and the interval between the openings 122A adjacent to each other in the X direction. The interval between the openings 121B and 122B adjacent to each other in the Y direction is equal to the interval between the openings 121A and 122A adjacent to each other in the Y direction.

In a state where the heights of the rear panel 120B, the front panel 120A, and the panel 110 are aligned with each other, the positions of the openings 111, 121A, and 121B coincide with each other and the positions of the openings 112, 122A, and 122B coincide with each other in front view.

The teeth portions 123B each serving as the rack of the rack-and-pinion are provided at both ends of the rear panel 120B in the X direction. Each teeth portion 123B has multiple teeth formed along the Z direction. The teeth of each teeth portion 123B are engaged with the gear 125C together with the corresponding teeth portion 123A of the front panel 120A. Both end portions of the rear panel 120B in the X direction where the teeth portions 123B are provided protrude in the −Y direction-side from a portion of the rear panel 120B where the openings 121B and 122B are provided. The teeth portion 123B on the −X direction side has the teeth facing the +X direction side and faces the teeth portion 123A of the front panel 120A on the −X direction side. The teeth portion 123B on the +X direction side has the teeth facing the −X direction side and faces the teeth portion 123A of the front panel 120A on the +X direction side. For example, the teeth of the two teeth portions 123B face the center side of the rear panel 120B in the X direction. Details of the configuration of the teeth portions 123B will be described later together with the configuration of the gear 125C of the frame 120C.

As an example, the portion of the rear panel 120B excluding the openings 121B and 122B and the teeth portions 123B have a structure such as a mesh structure with a large number of holes or a structure provided with a large number of holes by punching processing. The portion of the rear panel 120B excluding the openings 121B and 122B and the teeth portions 123B may be a wall having no holes.

[Frame 120C]

As illustrated in FIG. 2D, the frame 120C includes the base portion 121C, the support portions 122C, and the gears 125C, as an example. The meaning that the frame 120C includes the gears 125C is the same as the meaning that the panel 120 includes the gears 125C.

As an example, the base portion 121C is a member extending in the X direction, and has a small width in the Z direction. As an example, the length of the base portion 121C in the X direction is equal to the length of the rear panel 120B in the X direction. As an example, as illustrated in FIG. 2F, the base portion 121C is located on the −Y direction-side of the front panel 120A.

The support portions 122C extend in the +Z direction from both ends of the base portion 121C in the X direction. As an example, the support portions 122C are located on the −Y direction-side of the front panel 120A as illustrated in FIG. 2F, as similar to the base portion 121C. The support portions 122C are located on the −Y direction-sides of the teeth portions 123A at both ends of the front panel 120A in the X direction. As an example, the positions of the upper ends of the support portions 122C are equal to the positions of the upper ends of the front panel 120A and the rear panel 120B. The base portion 121C and the support portions 122C constitutes a U-shaped member in front view.

Each support portion 122C includes a guide rail extending in the Y direction. The front panel 120A and the rear panel 120B are engaged with the guide rails (not illustrated herein) of the support portions 122C so that the front panel 120A and the rear panel 120B may slide in the Z direction. The support portions 122C may hold the front panel 120A and the rear panel 120B at arbitrary positions in the up-down direction.

The base portion 121C and the support portions 122C may be integrally formed, or may be formed by joining members separately manufactured. As an example, the base portion 121C and the support portions 122C are made of a metal.

The gear 125C serving as a pinion of the rack-and-pinion is rotatably provided at a central portion in the Z direction of a +Y direction-side surface of each of the support portions 122C. One gear 125C is provided on each of the support portion 122C on the −X direction side and the support portion 122C on the +X direction side. The gear 125C is a circular gear and is rotatable in the XZ plane. The gear 125C is engaged with the teeth portion 123A of the front panel 120A and the teeth portion 123B of the rear panel 120B.

[Positional Relationship and Operation Between Teeth Portions 123A and 123B and Gear 125C]

As illustrated in FIGS. 2E and 2F, the teeth portions 123A and 123B are disposed so as to sandwich the gear 125C in the X direction.

The teeth of the two teeth portions 123A of the front panel 120A face outward in the X direction of the front panel 120A, and the teeth of the two teeth portions 123B of the rear panel 120B face the center side of the rear panel 120B in the X direction. The gear 125C is engaged with the teeth portions 123A and 123B located on both sides in the X direction.

For this reason, when the teeth portion 123A moves upward, the teeth portion 123B moves downward with a rotation of the gear 125C. In the same way, when the teeth portion 123A moves downward, the teeth portion 123B moves upward. When the teeth portion 123B moves upward, the teeth portion 123A moves downward with a rotation of the gear 125C. In the same way, when the teeth portion 123B moves downward, the teeth portion 123A moves upward. Since the movement amounts of the teeth portions 123A and 123B are equal to each other, the movement amounts of the front panel 120A and the rear panel 120B are equal to each other.

As illustrated in FIG. 1B, −Y direction-side ends of the joint members 140 provided on both sides in the X direction are fixed to lower ends at both ends of the base portion 121C of the frame 120C in the X direction. One joint member 140 is fixed to each of the lower ends at both ends of the base portion 121C in the X direction. Meanwhile, +Y direction-side ends of the joint members 140 are fixed to lower ends at both ends of the panel 130 in the X direction. For this reason, the interval between the panel 120 and the panel 130 in the Y direction is fixed.

The foregoing description has been given of the configuration of the panel 120 including the front panel 120A, the rear panel 120B, and the frame 120C as described above, in which the front panel 120A and the rear panel 120B are movable relative to the frame 120C in the opposite directions in the up-down directions. However, the configuration of the panel 120 is not limited to this configuration, and may be any configuration as long as the front panel 120A and the rear panel 120B are movable in the opposite directions in the up-down directions.

The configuration has been described above in which the movement amounts of the front panel 120A and the rear panel 120B are equal to each other. However, the panel 120 may have a configuration in which the movement amounts of the front panel 120A and the rear panel 120B are different from each other. For example, the panel 120 may have a configuration in which the front panel 120A and the rear panel 120B are made slidable relatively to each other in the up-down directions without interposing the gear 125C therebetween, and the front panel 120A and the rear panel 120B are manually slid.

[Panel 130]

As illustrated in FIG. 1A, the panel 130 is provided behind the panel 120 in the housing 101. The panel 130 is a plate-shaped member having a rectangular shape in front view. A longitudinal direction of the panel 130 is the X direction. As an example, the size of the panel 130 in front view is substantially equal to the sizes of the panel 110 and the panel 120 in front view. The panel 130 includes rectangular openings 131 and 132. The openings 131 and 132 are an example of third openings. Each of the openings 131 and 132 is not limited to a rectangular opening but may be, for example, a circular opening, an elliptic opening, or the like.

Two openings 131 and two openings 132 are aligned in the up-down direction, and the openings 131, 132, 131, and 132 are arranged in this order from top to bottom. Multiple openings 131 and 132 are aligned in the X direction. As an example, 16 openings 131 and 16 openings 132 are aligned in the X direction.

The opening size of the openings 131 is equal to the opening size of the openings 111. Similarly, the opening size of the openings 132 is equal to the opening size of the openings 112. Since the opening sizes of the openings 111 and 112 are equal to each other as an example, the opening sizes of the openings 131 and 132 are equal to each other as an example.

A layout of 16 openings 131 and 16 openings 132 is equal to the layout of the 16 openings 121A and the 16 openings 122A. For example, the interval between the openings 131 adjacent to each other in the X direction and the interval between the openings 132 adjacent to each other in the X direction are equal to the interval between the openings 111 adjacent to each other in the X direction and the interval between the openings 112 adjacent to each other in the X direction. The interval between the openings 131 and 132 adjacent to each other in the Y direction is equal to the interval between the openings 111 and 112 adjacent to each other in the Y direction.

For example, the interval between the openings 131 adjacent to each other in the X direction and the interval between the openings 132 adjacent to each other in the X direction are equal to the interval between the openings 121A adjacent to each other in the X direction and the interval between the openings 122A adjacent to each other in the X direction, and are equal to the interval between the openings 121B adjacent to each other in the X direction and the interval between the openings 122B adjacent to each other in the X direction.

The interval between the openings 131 and 132 adjacent to each other in the Y direction is equal to the interval between the openings 121A and 122A adjacent to each other in the Y direction and the interval between the openings 121B and 122B adjacent to each other in the Y direction.

In a state where the heights of the panel 130, the rear panel 120B, the front panel 120A, and the panel 110 are aligned with each other, the positions of the openings 111, 121A, 121B, and 131 coincide with each other and the positions of the openings 112, 122A, 122B, and 132 coincide with each other in front view.

The +Y direction-side ends of the joint members 140 provided on both sides in the X direction are fixed to lower ends at both ends of the panel 130 in the X direction. The joint members 140 are also fixed to the base portion 121C of the frame 120C of the panel 120. For this reason, the interval between the panel 130 and the panel 120 in the Y direction is fixed.

As an example, the portion of the panel 130 other than the openings 131 and 132 may have a structure such as a mesh structure with a large number of holes or a structure provided with a large number of holes by punching processing. The portion of the panel 130 other than the openings 131 and 132 may be a wall having no holes.

As an example, an electronic device that performs signal processing, arithmetic processing, or the like on digital signals output from the electronic modules 10 and 20 is disposed behind the panel 130 in the housing 101.

[Joint Member 140]

Each of the joint members 140 (see FIG. 1B) is a rod-shaped member extending in the Y direction between the −Y direction-side end fixed to the base portion 121C of the frame 120C of the panel 120 and the +Y direction-side end fixed to the panel 130. As an example, one joint member 140 is provided on each of both sides of the panels 120 and 130 in the X direction. The joint members 140 fix the panels 120 and 130 and keep the interval therebetween in the Y direction fixed.

Although the joint member 140 is illustrated separately from the guide rail 150 in FIG. 1B, the joint member 140 is slidable in the Y direction along the guide rail 150. For this reason, the panels 120 and 130 fixed by the joint members 140 are slidable along the guide rails 150 in a state where the interval in the Y direction is kept fixed. A distance in the Y direction between the panels 120 and 130 fixed by the joint members 140 is shorter than a length in the Y direction of the electronic modules inserted from the openings 112 of the panel 110 into the housing 101.

At least one joint member 140 may be provided or three or more joint members 140 may be provided. The joint members 140 just have to fix the panels 120 and 130 in the Y direction and keep the interval between the panels 120 and 130 in the Y direction fixed. The joint members 140 may be provided at positions between the upper ends and the lower ends on the ±X direction sides of the panels 120 and 130, on the upper sides or the lower sides of the panels 120 and 130, or the like. For example, the joint members 140 may be located outside a space where electronic modules to be described later may be present inside the housing 101.

[Guide Rail 150]

As an example, the guide rails 150 are disposed at lower ends of both ends in the housing 101 in the X direction and extend in the Y direction. As an example, each guide rail 150 is a rail having an L-shaped cross section in an XZ cross-sectional diagram. The guide rails 150 guide the joint members 140 so that the joint members 140 are movable in the Y direction.

A −Y direction-side end of each of the guide rails 150 is located directly behind (on the +Y side directly behind) the panel 110, and a +Y direction-side end of the guide rail 150 is located at, for example, an appropriate position between the front end 101A and the rear end 101B of the housing 101. The guide rails 150 only have to extend to such a position on the +Y direction-side that the panel 130 may be moved to a fourth position to be described later.

The shape of the guide rail 150 in the XZ cross-sectional diagram may be any shape as long as the guide rail 150 is able to guide the joint member 140. The positions and the number of the guide rails 150 may be determined corresponding to the positions and the number of the joint members 140.

[Mounting of Electronic Modules 10 and 20 on Module Mounting Device 100]

Figure 3A:
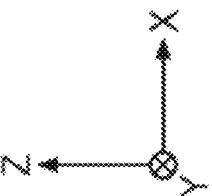
FIG. 3A is a diagram illustrating an example of a front view of a configuration of an information processing apparatus 1 in a first mode in the embodiment.
Figure 3B:
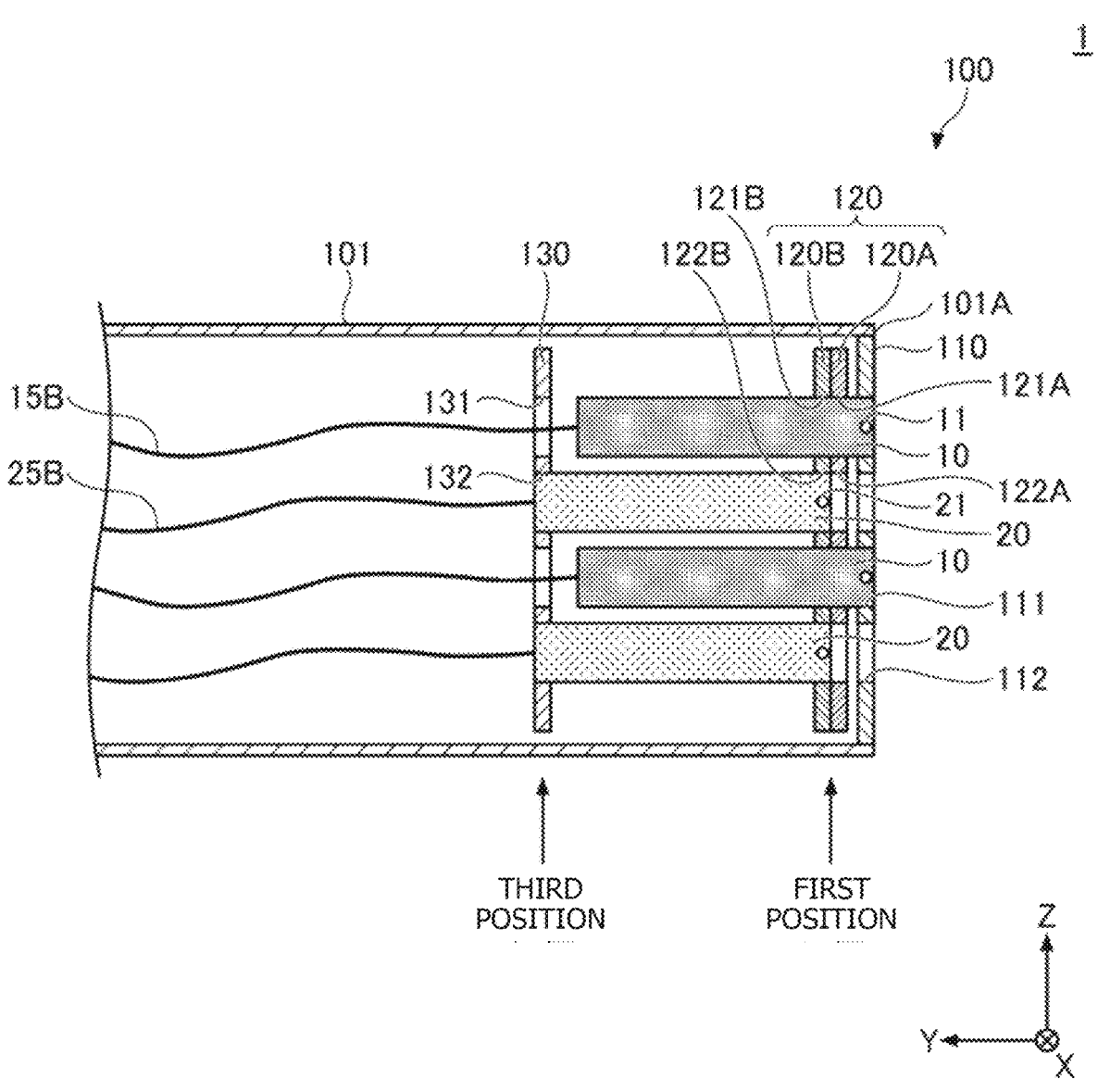
FIG. 3B is a diagram illustrating an example of a configuration of a cross section viewed from A-A arrows in FIG. 3A.

FIG. 3A is a diagram illustrating an example of a front view of a configuration of the information processing apparatus 1 in a first mode in the embodiment. FIG. 3B is a diagram illustrating an example of a configuration of a cross section viewed from A-A arrows in FIG. 3A that is a cross section equivalent to a cross section viewed from A-A arrows in FIG. 1A. The electronic modules 10 and 20 are illustrated in FIGS. 3A and 3B. FIG. 3B illustrates the thickness of each constituent element.

Each of the electronic modules 10 is an example of a first electronic module, and each of the electronic modules 20 is an example of a second electronic module. In FIG. 3B, cables 15B and 25B are coupled to rear sides of the electronic modules 10 and 20, respectively. The cables 15B and 25B are cables to which digital signals are output from the electronic modules 10 and 20.

The electronic modules 10 and 20 are multiple electronic modules mounted on the module mounting device 100. The electronic modules 10 and 20 are optical modules, servers, or the like as an example. The description will be given herein for a form in which the electronic modules 10 and 20 are optical modules as an example. The cross section viewed from A-A arrows in FIG. 3B is a cross section including side surfaces of the electronic modules 10 and 20 on the −X direction side. For this reason, FIG. 3B illustrates the side surfaces of the electronic modules 10 and 20 on the −X direction side and the cross sections of the housing 101, the panel 110, the front panel 120A, the rear panel 120B, and the panel 130. The frame 120C of the panel 120, the joint members 140, and the guide rails 150 are omitted in FIG. 3B.

Inside the housing 101, each of the electronic modules 10 is attached to the opening 111 of the panel 110 via a rotary shaft 11. A front end portion of the electronic module 10 is attached to the rotary shaft 11. As an example, the front end portion of the electronic module 10 is a portion extending from the front end of the electronic module 10 by about 15% to 20% of the length of the electronic module 10 in the Y direction. A hinge or the like may be used instead of the rotary shaft 11.

Inside the housing 101, each of the electronic modules 20 is attached to the opening 121B of the rear panel 120B via a rotary shaft 21. A front end portion of the electronic module 20 is attached to the rotary shaft 21. As an example, the front end portion of the electronic module 20 is a portion extending from the front end of the electronic module 20 by about 15% to 20% of the length of the electronic module 20 in the Y direction. A hinge or the like may be used instead of the rotary shaft 21.

The electronic modules 10 and 20 are attached to the openings 111 and 121B via the rotary shafts 11 and 21, respectively, as described above not only in the first mode but also in other modes in which the panels 120 and 130 are moved in the +Y direction.

The electronic modules 10 and 20 only have to be rotatable about the rotary shafts 11 and 21 by a predetermined angle when the front panel 120A is moved downward and the rear panel 120B is moved upward in a state where the panel 120 is moved in the +Y direction to a second position to be described later. When the information processing apparatus 1 is in a usage state, the electronic modules 10 and 20 are held in a state rotated by a predetermined angle and inclined with respect to the horizontal plane. As an example, the predetermined angle is about 5 degrees to 30 degrees.

Here, in order to simplify the description, as an example, the electronic modules 10 and 20 will be described as constituent elements each having a rectangular parallelepiped outer shape. However, the electronic modules 10 and 20 may actually have various shapes. For this reason, in a state where the electronic modules 10 and 20 are inserted in the openings 111 and 112 of the panel 110, the openings 121A and 122A of the front panel 120A, the openings 121B and 122B of the rear panel 120B, and the openings 131 and 132 of the panel 130, gaps are generated between the electronic modules 10 and 20 and these openings.

The electronic modules 10 and 20 may be inserted into the housing 101 from the openings 111 and 112 of the panel 110 as an example, but may be inserted into the housing 101 from the openings 131 and 132 of the panel 130.

[First Mode of Information Processing Apparatus 1]

The first mode of the information processing apparatus 1 is an initial mode of the information processing apparatus 1. The first mode of the information processing apparatus 1 is a mode in which the electronic modules 10 and 20 are attached to the rotary shafts 11 and 21 inside the housing 101, the front panel 120A and the rear panel 120B of the panel 120 are located at a first position, the panel 130 is located at a third position, and the panels 110, 120, and 130 satisfy the following conditions.

In the first mode, the heights of the panels 110, 120, and 130 are aligned with each other. For example, in front view, the positions of the openings 111, 121A, 121B, and 131 coincide with each other, and the positions of the openings 112, 122A, 122B, and 132 coincide with each other.

The first position is a position directly behind (on the +Y side directly behind) the panel 110 in the Y direction. In a state where the front panel 120A and the rear panel 120B of the panel 120 are located at the first position, the front panel 120A and the rear panel 120B are located closest to the panel 110. Strictly speaking, the front panel 120A and the rear panel 120B are adjacent to each other in the Y direction and are located at different positions in the Y direction. However, the position where both of the front panel 120A and the rear panel 120B are located closest to the panel 110 is referred to as the first position. The meaning that the front panel 120A and the rear panel 120B are located at the first position is the same as the meaning that the panel 120 is located at the first position.

When the front panel 120A and the rear panel 120B are located at the first position, the −Y direction-side surfaces of the support portions 122C of the frame 120C may be in contact with the +Y direction-side surface of the panel 110. When the front panel 120A and the rear panel 120B are located at the first position, very narrow gaps of, for example, about several millimeters may be formed between the −Y direction-side surfaces of the support portions 122C of the frame 120C and the +Y direction-side surface of the panel 110. As an example, when the front panel 120A and the rear panel 120B are located at the first position, an interval between the −Y direction-side surface of the front panel 120A and the +Y direction-side surface of the panel 110 is about several millimeters to several tens of millimeters.

The third position is a position shifted from the first position to the +Y direction-side by the distance between the panels 120 and 130 joined by the joint members 140. The third position is a position at which the panel 130 is located closest to the panel 110.

As illustrated in FIG. 3A, in front view of the module mounting device 100 in the first mode, the electronic modules 10 are seen in the openings 111 and the electronic modules 20 are seen in the openings 112. Since the electronic modules 20 are actually located in the openings 122B of the rear panel 120B, the electronic modules 20 are seen in the openings 122B through the openings 112 and 122A. Four small circles illustrated in each of the electronic modules 10 and 20 are connectors for coupling optical fibers.

As illustrated in FIG. 3B, in the first mode, the electronic modules 10 are inserted in the openings 111 of the panel 110, the openings 121A of the front panel 120A, and the openings 121B of the rear panel 120B. The electronic modules 10 are each held such that the front end portion thereof is attached to the opening 111 of the panel 110 via the rotary shaft 11 and the portion thereof behind the front end portion is inserted in the openings 121A and 121B.

As illustrated in FIG. 3B, in the first mode, the electronic modules 20 are inserted in the openings 122B of the rear panel 120B and the openings 132 of the panel 130. The electronic modules 20 are each held such that the front end portion thereof is attached to the opening 122B of the rear panel 120B via the rotary shaft 21 and a rear end portion thereof is inserted in the opening 132 of the panel 130. As an example, the rear end portion of the electronic module 20 is a portion extending from the rear end of the electronic module 20 by about 15% to 20% of the length of the electronic module 20 in the Y direction.

Figure 3C:
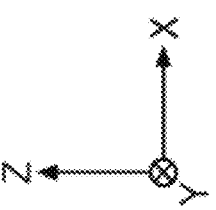
FIG. 3C is a diagram illustrating an example of a front view of a state of the panel 110 in the first mode.
Figure 3D:
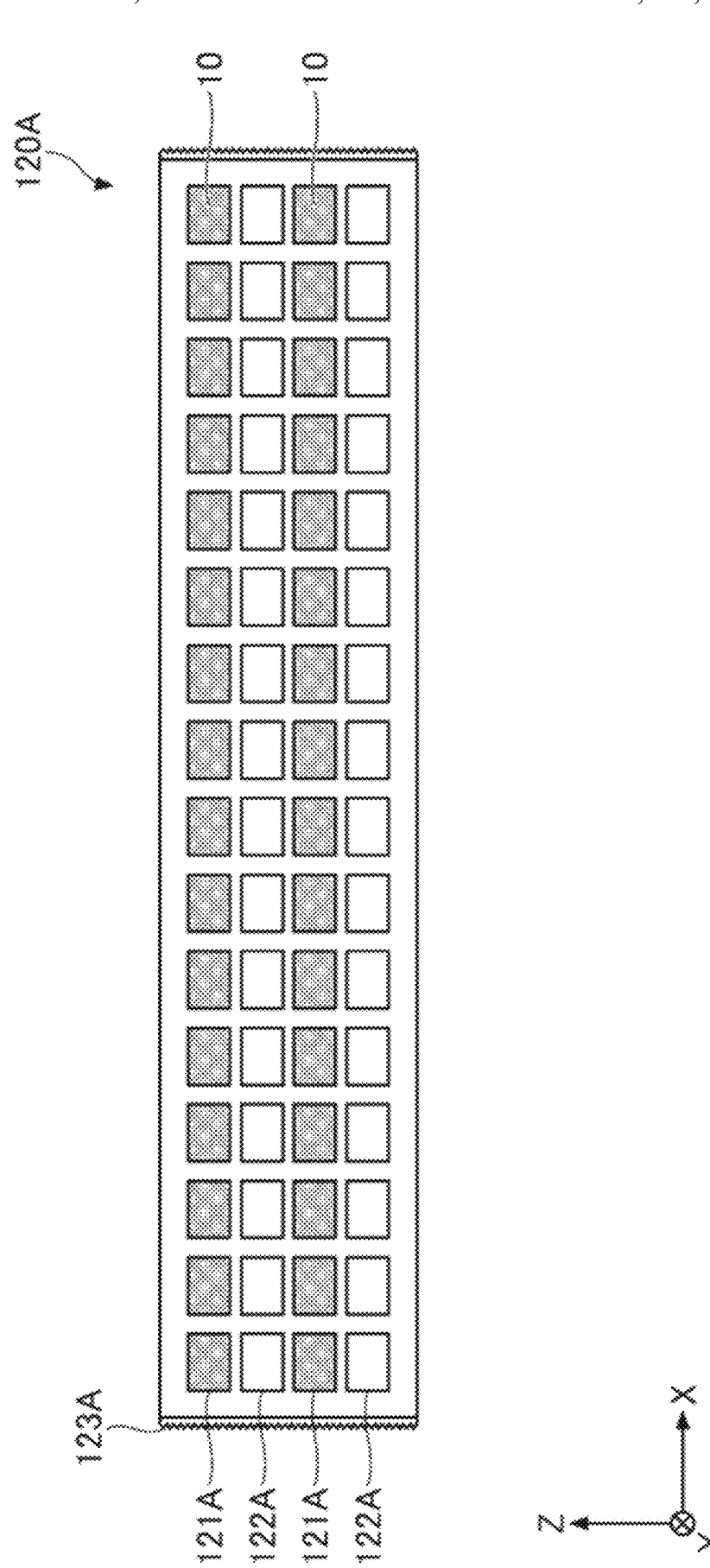
FIG. 3D is a diagram illustrating an example of a front view of a state of the front panel 120A in the first mode.
Figure 3E:
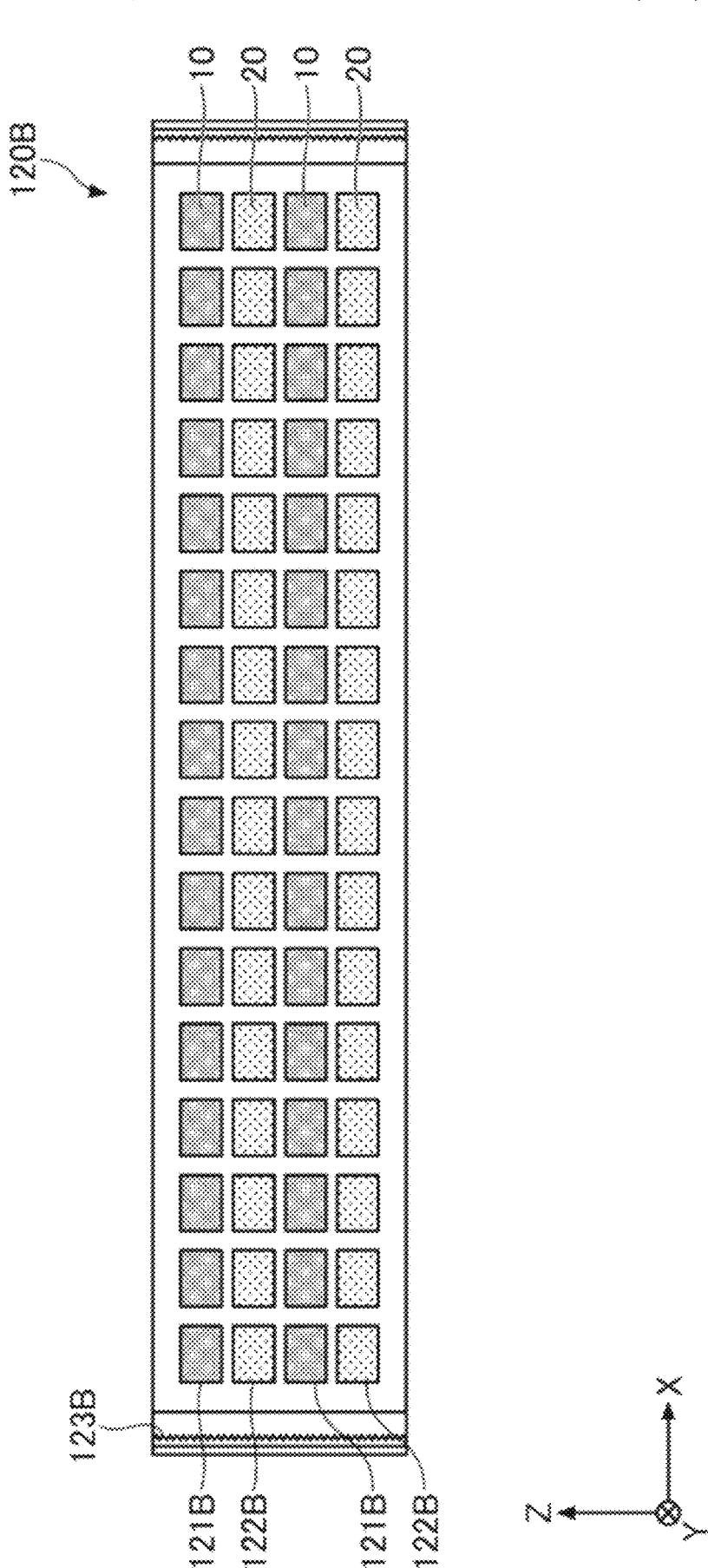
FIG. 3E is a diagram illustrating an example of a front view of a state of the rear panel 120B in the first mode.
Figure 3F:
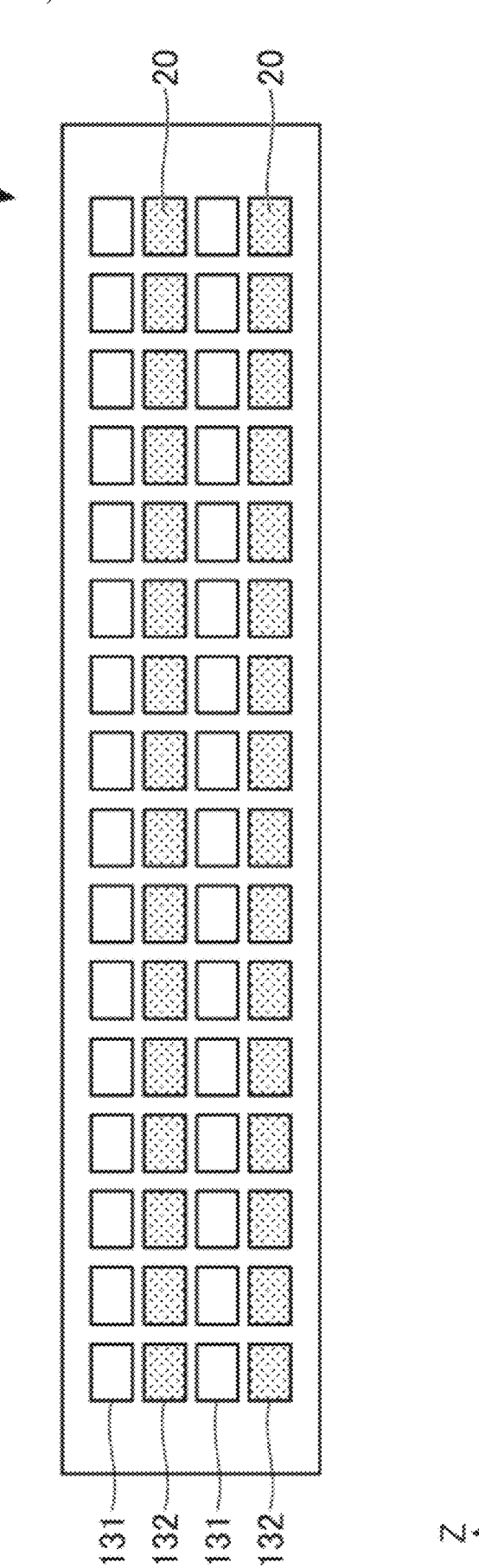
FIG. 3F is a diagram illustrating an example of a front view of a state of the panel 130 in the first mode.

Next, states of the panel 110, the front panel 120A, the rear panel 120B, and the panel 130 in the first mode in front view will be described with reference to FIGS. 3C to 3F. FIG. 3C is a diagram illustrating an example of a front view of a state of the panel 110 in the first mode. FIG. 3D is a diagram illustrating an example of a front view of a state of the front panel 120A in the first mode. FIG. 3E is a diagram illustrating an example of a front view of a state of the rear panel 120B in the first mode. FIG. 3F is a diagram illustrating an example of a front view of a state of the panel 130 in the first mode.

As illustrated in FIG. 3C, in the panel 110 in the first mode, the electronic modules 10 are located in the openings 111, but the electronic modules 20 are not located in the openings 112.

As illustrated in FIG. 3D, in the front panel 120A in the first mode, the electronic modules 10 are located in the openings 121A, but the electronic modules 20 are not located in the opening 122A.

As illustrated in FIG. 3E, in the rear panel 120B in the first mode, the electronic modules 10 are located in the openings 121B and the electronic modules 20 are located in the openings 122B.

As illustrated in FIG. 3F, in the panel 130 in the first mode, the electronic modules 10 are not located in the openings 131, but the electronic modules 20 are located in the openings 132.

[Second Mode of Information Processing Apparatus 1]

Figure 4A:
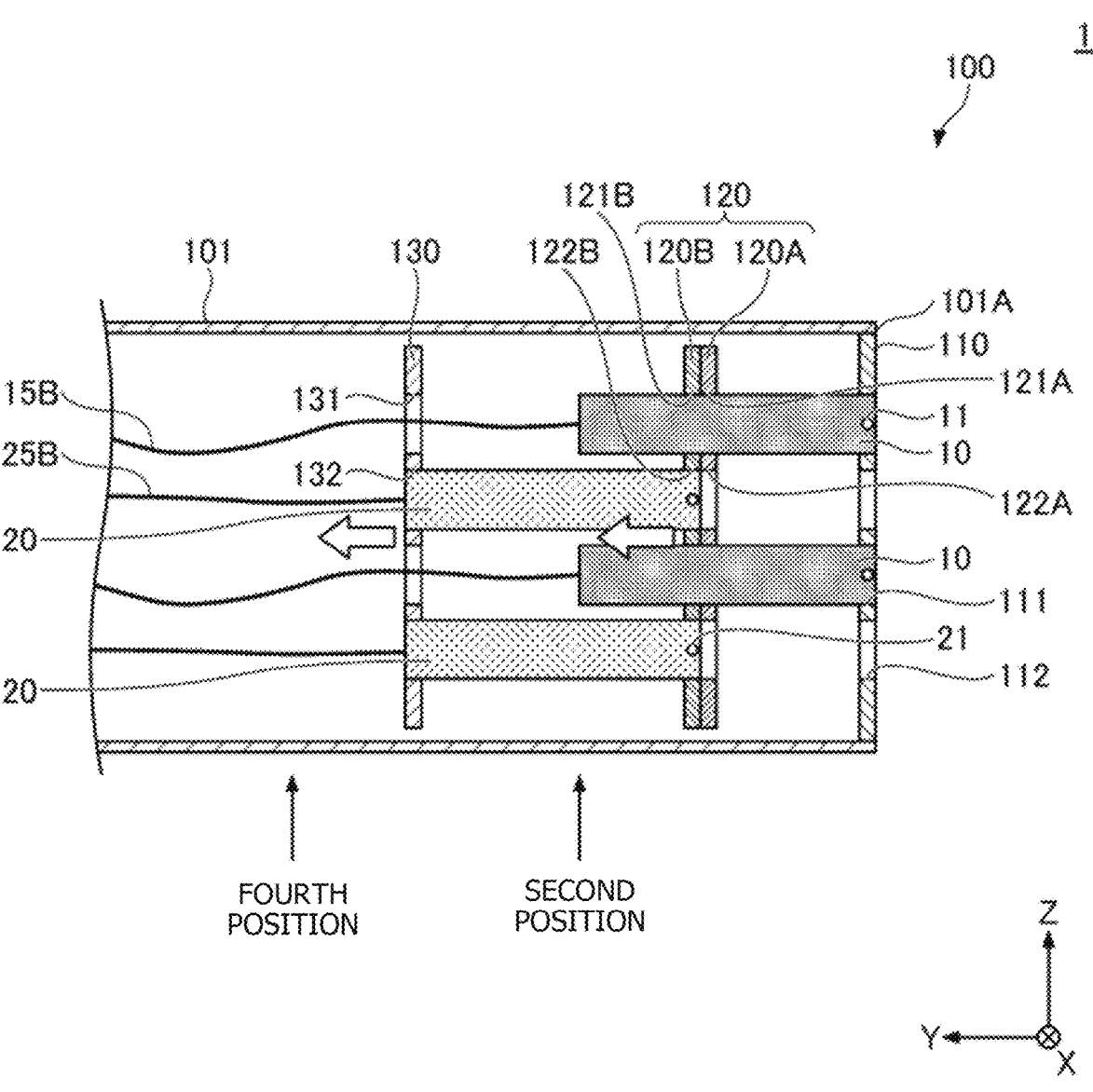
FIG. 4A is a cross-sectional diagram illustrating an example of a state in the process of moving the panels 120 and 130 in a +Y direction in the information processing apparatus 1.
Figure 4B:
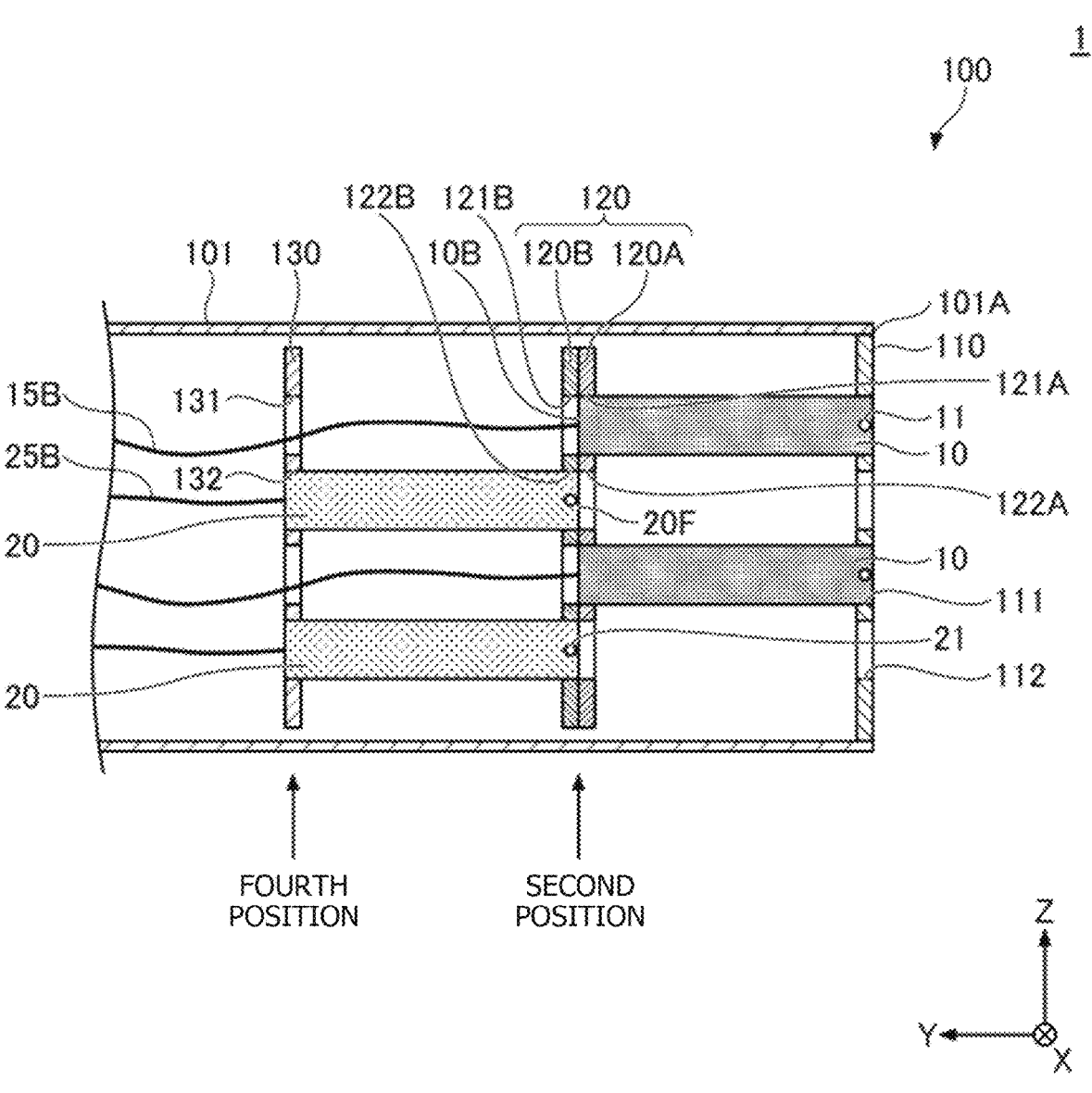
FIG. 4B is a cross-sectional diagram illustrating an example of a configuration of the information processing apparatus 1 in a second mode.

FIG. 4A is a cross-sectional diagram illustrating an example of a state in the process of moving the panels 120 and 130 in the +Y direction in the information processing apparatus 1. FIG. 4B is a cross-sectional diagram illustrating an example of a configuration of the information processing apparatus 1 in a second mode in the embodiment. FIGS. 4A and 4B illustrate the thickness of each constituent element.

The second mode is a mode in which the panels 120 and 130 are moved to the second position and the fourth position, respectively, in the information processing apparatus 1. The cross sections illustrated in FIGS. 4A and 4B are cross sections at the same position as the cross section illustrated in FIG. 3B. In FIG. 4B, a reference sign 10B is attached to the rear end surface of the electronic module 10, and a reference sign 20F is attached to the front end surface of the electronic module 20. The rear end surfaces 10B of the electronic modules 10 and the front end surfaces 20F of the electronic modules 20 will be described later with reference to FIG. 5B.

The second position is a position to which the front panel 120A and the rear panel 120B are moved in the +Y direction until the rear ends of the electronic modules 10 get out of the openings 121B of the rear panel 120B in the Y direction. Strictly speaking, the front panel 120A and the rear panel 120B are adjacent to each other in the Y direction and are located at different positions in the Y direction. However, the position at which the rear ends of the electronic module 10 get out of the openings 121B of the rear panel 120B is referred to as the second position of the front panel 120A and the rear panel 120B. The meaning that the front panel 120A and the rear panel 120B are located at the second position is the same as the meaning that the panel 120 is located at the second position.

The fourth position is a position of the panel 130 located when the front panel 120A and the rear panel 120B are located at the second position. The fourth position is a position shifted from the second position to the +Y direction-side by the distance between the panels 120 and 130 joined by the joint members 140.

The state illustrated in FIG. 4A is a state (transient state) in the process of moving the panels 120 and 130 while the information processing apparatus 1 is transitioning from the first mode illustrated in FIG. 3B to the second mode illustrated in FIG. 4B. In this state, as illustrated in FIG. 4A, the electronic modules 10 are inserted in the openings 111 of the panel 110, the openings 121A of the front panel 120A, and the openings 121B of the rear panel 120B. The electronic modules 10 are each held such that the front end portion thereof is attached to the opening 111 of the panel 110 via the rotary shaft 11 and a portion thereof between the front end portion and a rear end portion is inserted in the openings 121A and 121B. As an example, the rear end portion of the electronic module 10 is a portion extending from the rear end of the electronic module 10 by about 15% to 20% of the length of the electronic module 10 in the Y direction.

In the state illustrated in FIG. 4A, the electronic modules 20 are each held such that the front end portion thereof is attached to the opening 122B of the rear panel 120B via the rotary shaft 21 and the rear end portion thereof is inserted in the opening 132 of the panel 130. In this state, the electronic modules 10 and 20 overlap each other in the Y direction.

As illustrated in FIG. 4B, in the second mode, the electronic modules 10 are inserted in the openings 111 of the panel 110 and the openings 121A of the front panel 120A located at the second position, and the rear ends of the electronic modules 10 get out of the openings 121B of the rear panel 120B located at the second position. The electronic modules 10 are each held such that the front end portion thereof is attached to the opening 111 of the panel 110 via the rotary shaft 11 and the rear end portion thereof is inserted in the opening 121A.

In the second mode, as illustrated in FIG. 4B, the electronic modules 20 are inserted in the openings 120B of the rear panel 122B located at the second position and the openings 132 of the panel 130 located at the fourth position. The electronic modules 20 are each held such that the front end portion thereof is attached to the opening 122B of the rear panel 120B via the rotary shaft 21 and a rear end portion thereof is inserted in the opening 132 of the panel 130.

As described above, when the information processing apparatus 1 is in the second mode, the rear ends of the electronic modules 10 and the front ends of the electronic modules 20 do not overlap each other in the Y direction.

Figure 4C:
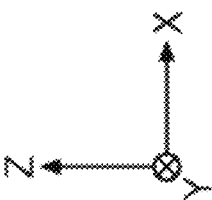
FIG. 4C is a diagram illustrating an example of a front view of a state of the panel 110 in the second mode.
Figure 4D:
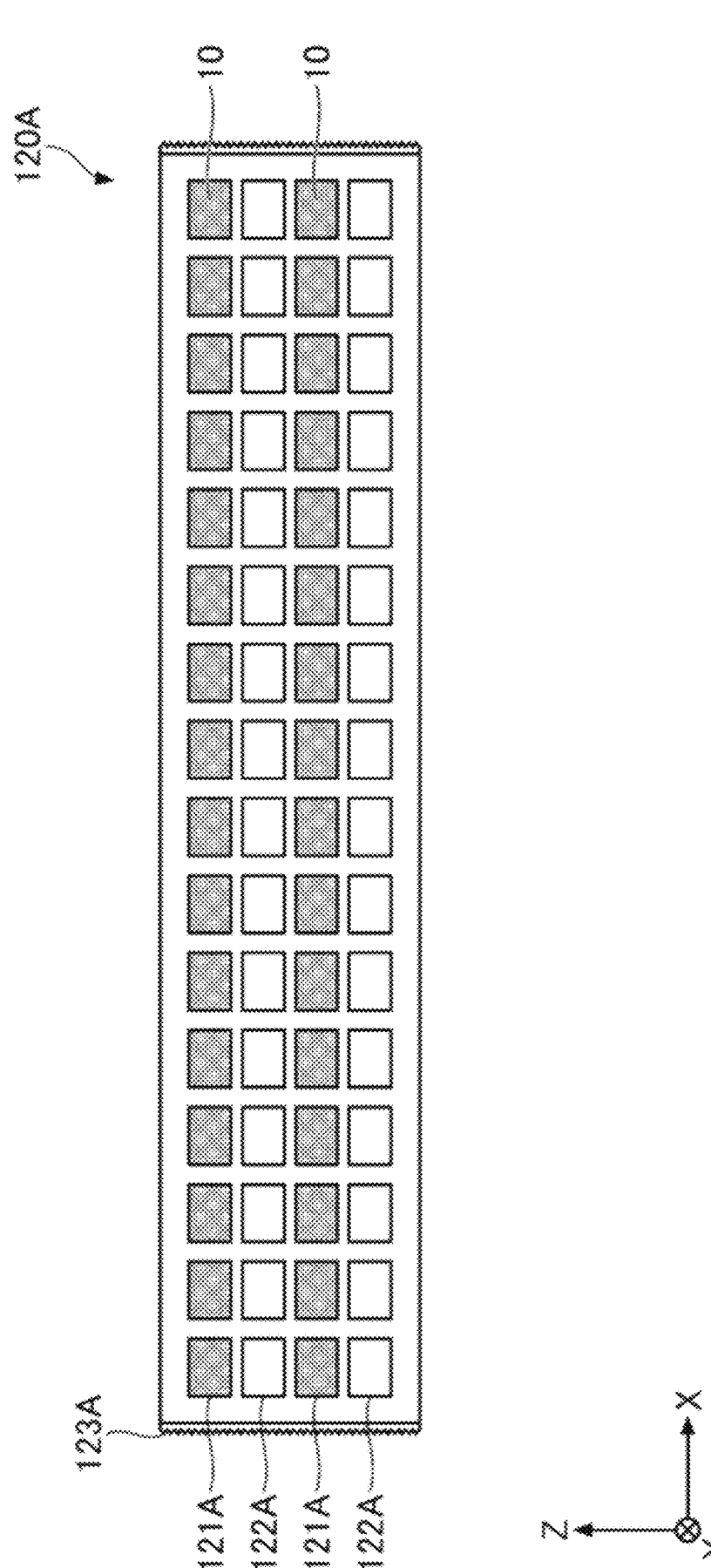
FIG. 4D is a diagram illustrating an example of a front view of a state of the front panel 120A in the second mode.
Figure 4E:
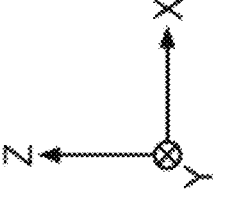
FIG. 4E is a diagram illustrating an example of a front view of a state of the rear panel 120B in the second mode.
Figure 4F:
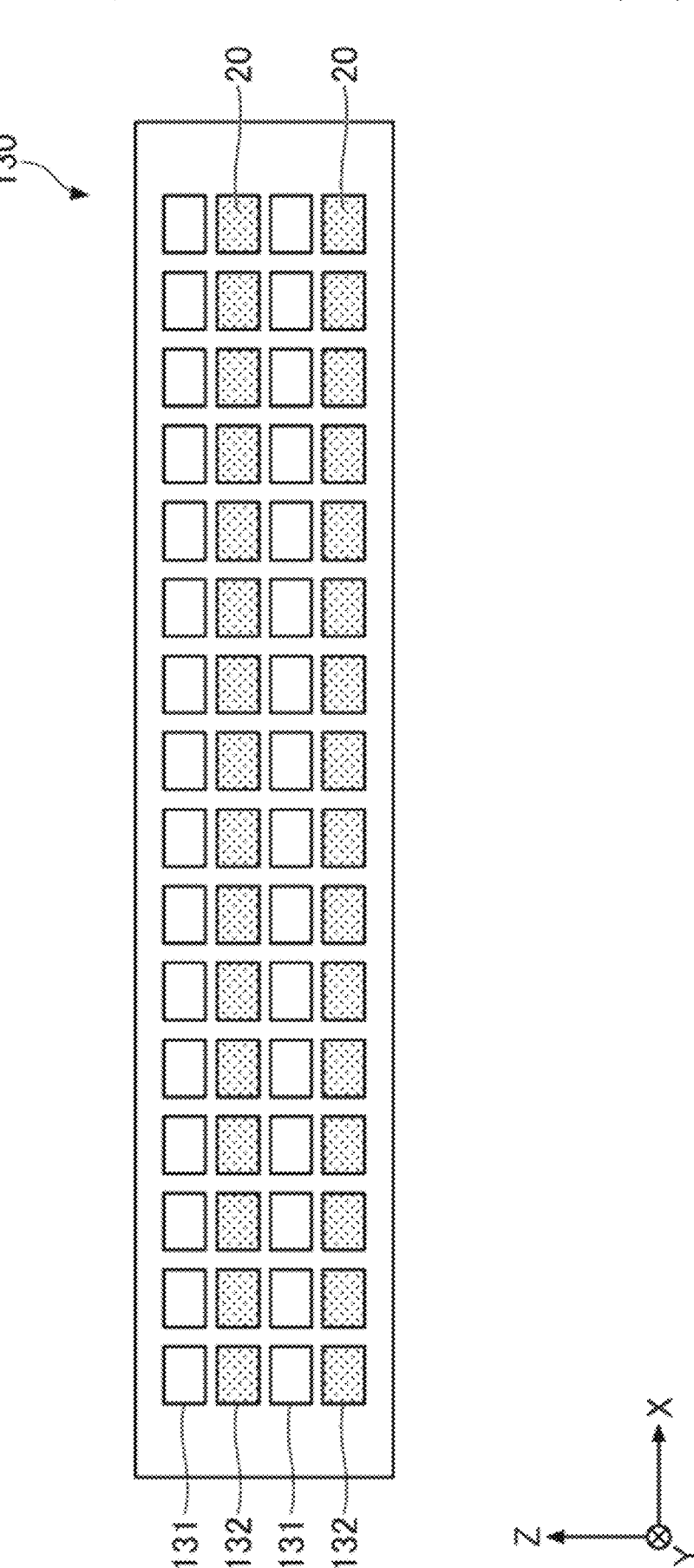
FIG. 4F is a diagram illustrating an example of a front view of a state of the panel 130 in the second mode.

Next, states of the panel 110, the front panel 120A, the rear panel 120B, and the panel 130 in the second mode in front view will be described with reference to FIGS. 4C to 4F. FIG. 4C is a diagram illustrating an example of a front view of a state of the panel 110 in the second mode. FIG. 4D is a diagram illustrating an example of a front view of a state of the front panel 120A in the second mode. FIG. 4E is a diagram illustrating an example of a front view of a state of the rear panel 120B in the second mode. FIG. 4F is a diagram illustrating an example of a front view of a state of the panel 130 in the second mode.

As illustrated in FIG. 4C, in the panel 110 in the second mode, the electronic modules 10 are located in the openings 111, but the electronic modules 20 are not located in the openings 112.

As illustrated in FIG. 4D, in the front panel 120A in the second mode, the electronic modules 10 are located in the openings 121A, but the electronic modules 20 are not located in the openings 122A.

As illustrated in FIG. 4E, in the rear panel 120B in the second mode, the electronic modules 10 are not located in the openings 121B, but the electronic modules 20 are located in the openings 122B. This is because the rear ends of the electronic modules 10 get out of the openings 121B of the rear panel 120B in the second mode.

As illustrated in FIG. 4F, in the panel 130 in the second mode, the electronic modules 10 are not located in the openings 131, but the electronic modules 20 are located in the openings 132.

[Third Mode of Information Processing Apparatus 1]

FIG. 5A is a cross-sectional diagram illustrating an example of a configuration of the information processing apparatus 1 in a third mode. FIG. 5A illustrates the thickness of each constituent element. The cross section illustrated in FIG. 5A is a cross section at the same position as the cross sections illustrated in FIGS. 3B, 4A, and 4B.

The third mode is a mode in which the front panel 120A is moved downward and the rear panel 120B is moved upward from the second mode of the information processing apparatus 1. Since the rear ends of the electronic modules 10 and the front ends of the electronic modules 20 do not overlap each other in the Y direction in the second mode, the electronic modules 10 and 20 may be shifted into the third mode without having the rear ends of the electronic modules 10 and the front ends of the electronic modules 20 interfering with each other. In FIG. 5A, cables 15A and 25A are coupled to the front sides of the electronic modules 10 and 20, respectively. The cables 15A and 25A are optical fiber cables from which optical signals are input to the electronic modules 10 and 20.

FIG. 5B is a see-through diagram illustrating a positional relationship in front view between the rear end surfaces 10B of the electronic modules 10 and the front end surfaces 20F of the electronic modules 20 in the second mode of the information processing apparatus 1. The rear end surfaces 10B and the front end surfaces 20F illustrated in FIG. 5B illustrate the positional relationship in front view between the rear end surfaces 10B and the front end surfaces 20F in FIG. 4B.

FIG. 5C is a see-through diagram illustrating a positional relationship in front view between the rear end surfaces 10B of the electronic modules 10 and the front end surfaces 20F of the electronic modules 20 in the third mode of the information processing apparatus 1.

In the second mode, the front panel 120A and the rear panel 120B are not shifted in the up-down directions, and the electronic modules 10 and 20 are accordingly parallel to the XY plane and are located at different positions in the height direction, so that the rear end surfaces 10B are separated from the front end surfaces 20F in the Z direction as illustrated in FIG. 5B.

In the third mode illustrated in FIG. 5A, the front panel 120A is shifted downward and the rear panel 120B is shifted upward as compared with the second mode illustrated in FIG. 4B. For this reason, the rear end surfaces 10B overlap the front end surfaces 20F in the Z direction as illustrated in FIG. 5C. For example, the rear end surfaces 10B and the front end surfaces 20F have overlapping portions as illustrated in FIG. 5C.

FIG. 5D is a diagram illustrating an example of a front view of a configuration of the information processing apparatus 1 in the third mode in the embodiment. As illustrated in FIG. 5D, in front view of the module mounting device 100 in the third mode, the electronic modules 10 are seen in the openings 111, but the electronic modules 20 are not seen in the openings 112.

As illustrated in FIG. 5A, the electronic modules 20 are located on the +Y direction-side of the electronic modules 10, and the front panel 120A is shifted downward whereas the rear panel 120B is shifted upward. As a result, the rear end surfaces 10B overlap the front end surfaces 20F in the Z direction as illustrated in FIG. 5C. For this reason, in the third mode, the electronic modules 20 are hardly seen in the openings 112 in front view of the module mounting device 100.

Whether the electronic module 10 or 20 is seen in each of the openings of the panel 110, the front panel 120A, the rear panel 120B, and the panel 130 in the third mode is the same as in the states illustrated in FIGS. 4C to 4F in the second mode, and thus description thereof is omitted herein.

FIG. 5E is a diagram illustrating an example of spaces around the electronic modules 10 and 20 in the housing 101 in the third mode. FIG. 5E illustrates the thickness of each constituent element. As indicated by broken line ellipses in FIG. 5E, there are spaces around the electronic modules 10 and 20.

FIG. 5F is a diagram illustrating an example of air flow passages obtained in the housing 101 in the third mode. FIG. 5F illustrates the thickness of each constituent element. As an example, description will be given of flow passages in a case where an electric fan disposed on the +Y direction-side of the panel 130 performs suction. Similar flow passages may be also obtained in a case where an electric fan disposed on the −Y direction-side of the panel 110 blows air.

As illustrated in FIG. 5F, the electronic modules 20 are located on the +Y direction-side of the electronic modules 10, and the front panel 120A is shifted downward whereas the rear panel 120B is shifted upward, so that flow passages extending in an obliquely downward direction from the panel 110 toward the panel 130 are obtained like a flow passage of an arrow (A). The flow passage of the arrow (A) is a flow passage coming into from the upper opening 112 of the panel 110, passing the upper opening 122A of the front panel 120A and the lower opening 121B of the rear panel 120B, and going out from the lower opening 131 of the panel 130. The flow passage of the arrow (A) passes between the two electronic modules 10 neighboring in the up-down direction and between the two electronic modules 20 neighboring in the up-down direction. Having lower ventilation resistance than the walls having holes such as meshes, the openings 122A and 121B exert a higher cooling effect.

As indicated by an arrow (B), a flow passage is obtained which extends in an obliquely downward direction from the panel 110 to the panel 130 through the wall of the panel 110 and the wall of the front panel 120A and through the upper opening 121B of the rear panel 120B and the upper opening 131 of the panel 130. The flow passage of the arrow (B) passes over the upper electronic modules 10 and 20. When the air passes through the wall of the panel 110, the air passes through the holes in the wall of the panel 110 such as a mesh, or passes through a gap between the upper opening 111 and the electronic module 10 or the like. When the air passes through the wall of the front panel 120A, the air passes through the holes in the wall of the front panel 120A such as a mesh, or passes through a gap between the upper opening 121A and the electronic module 10 or the like.

As indicated by an arrow (C), a flow passage is obtained which extends in the obliquely downward direction from the panel 110 to the panel 130 through the lower opening 112 of the panel 110 and the lower opening 122A of the front panel 120A, and further through the wall of the rear panel 120B and the wall of the panel 130. The flow passage of the arrow (C) passes under the lower electronic modules 10 and 20. When the air passes through the wall of the rear panel 120B, the air passes through the holes in the wall of the rear panel 120B such as a mesh or passes through a gap between the lower opening 122B and the electronic module 20 or the like. When the air passes through the wall of the panel 130, the air passes through the holes in the wall of the panel 130 such as a mesh or passes through a gap between the lower opening 132 and the electronic module 20 or the like.

In a case where the ±X direction-side walls, the upper side wall, and the lower side wall of the housing 101 have holes like a mesh or the like, various flow passages passing through the walls of the housing 101 in addition to the flow passages (A) to (C) are obtained with the flow passages (A) to (C) obtained in the third mode.

As described above, in the third mode, the electronic modules 20 are located on the +Y direction-side of the electronic modules 10, and the front panel 120A is shifted downward whereas the rear panel 120B is shifted upward, so that the spaces indicated by the broken line ellipses are obtained inside the housing 101. Since the spaces indicated by the broken line ellipses are obtained inside the housing 101, the flow passages of the arrows (A) to (C) are obtained. The various flow passages are also obtained in addition to the flow passages of the arrows (A) to (C).

Although the flow passages (arrows (A) to (C)) through which the air flows from the front surface side where the panel 110 is located to the rear side where the panel 130 is located has been described with reference to FIG. 5F, the flow passages may be flow passages through which the air flows from the rear side where the panel 130 is located to the front side where the panel 110 is located. For example, such flow passages are obtained in a case where an electric fan disposed on the −Y direction-side of the panel 110 performs suction or in a case where an electric fan disposed on the +Y direction-side of the panel 130 blows air.

As the data volume and the like increase, the electronic modules 10 and 20 are mounted at a higher density and tend to generate a larger amount of heat. For this reason, it is desirable to ensure sufficient cooling performance. It is also desired to reduce power consumption concurrently while ensuring the cooling performance.

By establishing the third mode, the module mounting device 100 in the embodiment obtains the flow passages of the arrows (A) to (C) and other various flow passages. As a result, the module mounting device 100 is able to efficiently cool the multiple electronic modules 10 and 20.

Although the configuration in which the rear ends of the electronic modules 10 are shifted downward and the front ends of the electronic modules 20 are shifted upward has been described above, the rear ends of the electronic modules 10 may be shifted upward and the front ends of the electronic modules 20 may be shifted downward. Also in this case, spaces are generated around the electronic modules 10 and 20, and flow passages as indicated by the arrows (A) to (C) (see FIG. 5F) are obtained. In this case, the flow passages extending in an obliquely upward direction from the panel 110 toward the panel 130 are obtained.

The configuration in which the rear ends of the electronic modules 10 are shifted downward and the front ends of the electronic modules 20 are shifted upward has been described above. However, for example, the electronic modules 10 and 20 may be disposed next to each other in the X direction, the rear ends of the electronic modules 10 may be shifted in one of the +X direction and the –X direction, and the front ends of the electronic modules 20 may be shifted in the other of the +X direction and the –X direction.

The configuration in which the front end portions of the electronic modules 20 are attached to the openings 122B of the rear panel 120B via the rotary shafts 21 has been described above. However, the rear end portions of the electronic modules 20 may be attached to the openings 132 of the panel 130 via the rotary shafts 21. The front end portions of the electronic modules 20 may be attached to the openings 122B of the rear panel 120B via the rotary shafts 21, and the rear end portions of the electronic modules 20 may be attached to the openings 132 of the panel 130 via the rotary shafts 21.

[Effect]

The module mounting device 100 includes the housing 101 in which the electronic modules 10 and the electronic modules 20 are housed, and which has the front end 101A and the rear end 101B. The module mounting device 100 includes the panel 110 that is provided on the front end 101A side of the housing 101, that has the openings 111 and 112 in which the electronic modules 10 and the electronic modules 20 are insertable, the front end portions of the electronic modules 10 is attached to the panel 110 while being inserted in the openings 111 and 112. The module mounting device 100 includes the panel 120 that is provided behind the panel 110, that has the openings 121A, 122A, 121B, and 122B in which the electronic modules 10 and the electronic modules 20 are insertable, and that is movable between the first position behind the panel 110 and the second position behind the first position. When the panel 120 is located at the first position, the front end portions of the electronic modules 10 and the front end portions of the electronic modules 20 are inserted in the openings 121A, 122A, 121B, and 122B. When the panel 120 is located at the second position, the front end portions of the electronic modules 20 are inserted in the openings 121B and 122B. The module mounting device 100 includes the panel 130 that is provided behind the panel 120 and that is movable between the third position behind the first position and the fourth position behind the third position. The module mounting device 100 includes the front end portions of the electronic modules 20 are attached to the panel 120 or the rear end portions of the electronic modules 20 are attached to the panel 130. In a state where the panel 120 is located at the second position and the panel 130 is located at the fourth position, the panel 120 is allowed to be shifted to a first side that is one direction in the up-down direction or a right-left direction. As a result, the rear ends of the electronic modules 10 and the front ends of the electronic modules 20 come close to each other and spaces are generated around the electronic modules 10 and 20, so that flow passages in a direction from the front end 101A of the housing 101 to the panel 130 are increased.

Accordingly, it is possible to provide the module mounting device 100 with improved cooling efficiency.

In a possible configuration, in a state where the panel 120 is located at the second position and the panel 130 is located at the fourth position, the electronic modules 10 and the electronic modules 20 do not have any overlapping area in a direction coupling the panel 110, the panel 120, and the panel 130. This configuration makes it possible to shift the electronic modules 10 and 20 without having the rear ends of the electronic modules 10 and the front ends of the electronic modules 20 interfering with each other, and secure more spaces around the electronic modules 10 and 20, so that flow passages in the direction from the front end 101A of the housing 101 to the panel 130 are increased. As a result, the cooling efficiency may be further improved.

The openings 111 and 112 may be two openings in which the electronic module 10 and the electronic module 20 are insertable, respectively. The configuration in which the electronic module 10 and the electronic module 20 are insertable in the respectively different openings 111 and 112 makes it possible to more stably shift the electronic modules 10 and 20.

The panel 120 may include the front panel 120A and the rear panel 120B provided behind the front panel 120A. In this case, the openings 121A, 122A, 121B, and 122B include the openings 121A and 122A provided in the front panel 120A and the openings 121B and 122B provided in the rear panel 120B. In a state where the front panel 120A and the rear panel 120B are located at the first position, the front end portions of the electronic modules 10 may be inserted in the openings 121A and 122A and the front end portions of the electronic modules 20 may be inserted to the openings 121B and 122B. In the state where the front panel 120A and the rear panel 120B are located at the second position, the rear end portions of the electronic modules 10 may be inserted in the openings 121A and 122A and the front end portions of the electronic modules 20 may be inserted in the openings 121B and 122B. Using the front panel 120A and the rear panel 120B, it is possible to more reliably shift the rear ends of the electronic modules 10 and the front ends of the electronic modules 20 and more reliably form the spaces around the electronic modules 10 and 20, so that the flow passages in the direction from the front end 101A of the housing 101 to the panel 130 may be increased. As a result, the cooling efficiency may be further improved.

The front end portions of the electronic modules 20 may be attached to the rear panel 120B. Since the electronic modules 20 are easily moved with a movement of the rear panel 120B, the front end portions of the electronic modules 20 may be more reliably shifted with the rear panel 120B. As a result, the cooling efficiency may be further improved.

The panel 120 may further include the rotatable gears 125C, the front panel 120A may include the teeth portions 123A that are engageable with the gears 125C and that are each formed along a direction coupling the first side to a second side in a direction opposite to the first side, the rear panel 120B may include the teeth portions 123B that are engageable with the gears 125C and are each formed along the direction coupling the first side and the second side. When the front panel 120A is shifted to the second side, the rear panel 120B may be shifted to the first side along with rotations of the gears 125C. Since use of the gears 125C makes it possible to shift the front panel 120A and the rear panel 120B in the opposite directions, the electronic modules 10 and 20 may be more reliably and easily shifted, and more spaces may be secured around the electronic modules 10 and 20, so that flow passages in the direction from the front end 101A of the housing 101 to the panel 130 are increased. As a result, the cooling efficiency may be further improved.

In a state where the rear ends of the electronic modules 10 are shifted to the second side and the front ends of the electronic modules 20 are shifted to the first side, the rear end surfaces 10B of the electronic modules 10 and the front end surfaces 20F of the electronic modules 20 may have overlapping portions in front view. This makes it possible to secure more spaces around the electronic modules 10 and 20, increase flow passages in an oblique direction from the front end 101A of the housing 101 to the panel 130, and further improve the cooling efficiency.

The openings 121A and 122A may be two openings in which the electronic module 10 and the electronic module 20 are insertable, respectively. Since the electronic module 10 and the electronic module 20 are insertable in the respectively different openings 121A and 122A, the electronic modules 10 and 20 may be more stably shifted.

The openings 121B and 122B may be two openings in which the electronic module 10 and the electronic module 20 are insertable, respectively. Since the electronic module 10 and the electronic module 20 are insertable in the different openings 121B and 122B, respectively, the electronic modules 10 and 20 may be more stably shifted.

The module mounting device 100 may further include the joint members 140 which join the panel 120 and the panel 130 and the guide rails 150 which are provided inside the housing 101 and which guide the joint members 140. When the joint members 140 are guided along the guide rails 150, the panel 120 and the panel 130 may be movable in the direction (Y direction) coupling the panel 110 and the panel 130. Since the panels 120 and 130 are easily movable in the front-rear direction (Y direction) of the housing 101, the cooling efficiency may be further improved.

The panel 130 may have the openings 131 and 132 in which the electronic modules 10 and the electronic modules 20 are insertable. The electronic modules 10 and the electronic modules 20 may be taken out to the outside of the housing 101 through the panel 130, and the cooling efficiency may be further improved by increasing the openings.

The openings 131 and 132 may be two openings in which the electronic module 10 and the electronic module 20 are insertable, respectively. Since the electronic module 10 and the electronic module 20 are insertable in the respectively different openings 131 and 132, the electronic module 20 may be shifted more stably.

The information processing apparatus 1 includes the electronic modules 10, the electronic modules 20, and the module mounting device 100 on which the electronic modules 10 and the electronic modules 20 are mounted. The module mounting device 100 includes the housing 101 in which the electronic modules 10 and the electronic modules 20 are housed and which has the front end 101A and the rear end 101B, the panel 110 that is provided on the front end 101A side of the housing 101, that has the openings 111 and 112 in which the electronic modules 10 and the electronic modules 20 are insertable, the front end portions of the electronic modules 10 being inserted in and attached to the openings 111 and 112, the panel 120 that is provided behind the panel 110, that has openings 121A, 122A, 121B, and 122B in which the electronic modules 10 and the electronic modules 20 are insertable, and that is movable between the first position behind the panel 110 and the second position behind the first position, and the panel 130 that is provided behind the panel 120 and that is movable between the third position behind the first position and the fourth position behind the third position. When the panel 120 is located at the first position, the front end portions of the electronic modules 10 and the front end portions of the electronic modules 20 are inserted in the openings 121A, 122A, 121B, and 122B. When the panel 120 is located at the second position, the front end portions of the electronic modules 20 are inserted in the openings 121B and 122B. The front end portions of the electronic modules 20 are attached to the panel 120 or the rear end portions of the electronic modules 20 are attached to the panel 130. In a state where the panel 120 is located at the second position and the panel 130 is located at the fourth position, the panel 120 is allowed to be shifted to a first side in the up-down direction or the right-left direction. As a result, the rear ends of the electronic modules 10 and the front ends of the electronic modules 20 come close to each other and spaces are generated around the electronic modules 10 and 20, so that flow passages in a direction from the front end 101A of the housing 101 to the panel 130 are increased.

Accordingly, it is possible to provide the information processing apparatus 1 with improved cooling efficiency.

[First Modification]

FIG. 5G is a diagram illustrating an example of a cross-sectional configuration of an information processing apparatus 1A in the third mode in a first modification of the embodiment. FIG. 5G illustrates the thickness of each constituent element. The information processing apparatus 1A has a configuration in which the module mounting device 100 of the information processing apparatus 1 illustrated in FIG. 5A is replaced with a module mounting device 100A.

The module mounting device 100A has a configuration in which the positions of the openings 111 and 112 of the panel 110, the positions of the openings 121A and 122A of the front panel 120A, the positions of the openings 121B and 122B of the rear panel 120B, and the positions of the openings 131 and 132 of the panel 130 are reversed in the up-down direction.

Accordingly, the positions of the electronic modules 10 and 20 are also reversed in the up-down direction in the information processing apparatus 1A.

As similar to the information processing apparatus 1 illustrated in FIG. 5A, the information processing apparatus 1A having such a configuration obtains flow passages similar to the flow passages illustrated with the arrows (A) to (C) in FIG. 5F, which makes it possible to provide the module mounting device 100A and the information processing apparatus 1A with improved cooling efficiency.

[Second Modification]

FIG. 6A is a diagram illustrating an example of a front view of a configuration of an information processing apparatus 1B in the first mode in a second modification of the embodiment. The information processing apparatus 1B has a configuration in which the module mounting device 100 of the information processing apparatus 1 in the embodiment is replaced with a module mounting device 100B.

The module mounting device 100B has a configuration in which the positions of the openings 111 and 112 of the panel 110, the positions of the openings 121A and 122A of the front panel 120A, the positions of the openings 121B and 122B of the rear panel 120B, and the positions of the openings 131 and 132 of the panel 130 are arranged at a check pattern in front view. For example, the layout of the openings 111 and 112 of the panel 110, the layout of the openings 121A and 122A of the front panel 120A, the layout of the openings 121B and 122B of the rear panel 120B, and the layout of the openings 131 and 132 of the panel 130 are reversed in the up-down direction on a column-by-column basis. As a result, in the first mode, the electronic modules 10 and 20 are arranged in a check pattern in front view as illustrated in FIG. 6A.

FIG. 6B is a diagram illustrating an example of a front view of a state of the panel 110 in the first mode. FIG. 6C is a diagram illustrating an example of a front view of a state of the front panel 120A in the first mode. FIG. 6D is a diagram illustrating an example of a front view of a state of the rear panel 120B in the first mode. FIG. 6E is a diagram illustrating an example of a front view of a state of the panel 130 in the first mode.

As illustrated in FIG. 6B, in the panel 110 in the first mode, the electronic modules 10 are located in the openings 111, but the electronic modules 20 are not located in the openings 112. Since the openings 111 and 112 are arranged in the check pattern in front view, the electronic modules 10 are also arranged in the check pattern in front view.

As illustrated in FIG. 6C, in the front panel 120A in the first mode, the electronic modules 10 are located in the openings 121A, but the electronic modules 20 are not located in the openings 122A. Since the openings 121A and 122A are arranged in the check patter in front view, the electronic modules 10 are also arranged in the check pattern in front view.

As illustrated in FIG. 6D, in the rear panel 120B in the first mode, the electronic modules 10 are located in the openings 121B and the electronic modules 20 are located in the openings 122B. Since the openings 121B and 122B are arranged in the check patter in front view, the electronic modules 10 and 20 are also arranged in a check pattern in front view.

As illustrated in FIG. 6E, in the panel 130 in the first mode, the electronic modules 10 are not located in the openings 131, but the electronic modules 20 are located in the openings 132. Since the openings 131 and 132 are arranged in the check patter in front view, the electronic modules 20 are also arranged in the check pattern in front view.

The above-described information processing apparatus 1B in the second and third modes is different from the information processing apparatus 1 in the embodiment in that the electronic modules 10 and 20 are arranged in the check pattern in front view, but is able to obtain the cooling effect in the same manner.

As a result, the rear ends of the electronic modules 10 and the front ends of the electronic modules 20 come close to each other and spaces are generated around the electronic modules 10 and 20, so that flow passages in a direction from the front end 101A of the housing 101 to the panel 130 are increased.

Accordingly, it is possible to provide the module mounting device 100B and the information processing apparatus 1B with improved cooling efficiency.

The module mounting devices and the information processing apparatuses in the exemplary embodiments of the present disclosure have been described above, but the present disclosure is not limited to the specifically disclosed embodiment, and various modifications and variations may be made without departing from the scope of the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A module mounting device comprising:
a housing configured to house a first electronic module and a second electronic module and include a front end and a rear end;
a first panel provided over a front end side of the housing and configured to include first openings in which the first electronic module and the second electronic module are insertable, a front end portion of the first electronic module being attached to the first panel while being inserted in a first opening of the first openings;
a second panel provided behind the first panel, configured to include second openings in which the first electronic module and the second electronic module are insertable, and movable between a first position behind the first panel and a second position behind the first position, the front end portion of the first electronic module and a front end portion of the second electronic module being inserted in the second openings in a state where the second panel is located at the first position, the front end portion of the second electronic module being inserted in a second opening of the second openings in a state where the second panel is located at the second position; and
a third panel provided behind the second panel and movable between a third position behind the first position and a fourth position behind the third position, wherein one of the front end portion and a rear end portion of the second electronic module is attached to one of the second panel and the third panel, respectively, and wherein, in a state where the second panel is located at the second position and the third panel is located at the fourth position, the second panel is allowed to be shifted to a first side that is one direction in one of an up-down direction and a right-left direction.

2. The module mounting device according to claim 1, wherein, in a state where the second panel is located at the second position and the third panel is located at the fourth position, the first electronic module and the second electronic module do not include an overlapping area in a direction coupling the first panel, the second panel, and the third panel.

3. The module mounting device according to claim 1, wherein the first openings are two openings in which the first electronic module and the second electronic module are insertable, respectively.

4. The module mounting device according to claim 1, wherein the second panel includes a second front panel and a second rear panel provided behind the second front panel,
wherein the second openings include at least a second front opening provided in the second front panel and at least a second rear opening provided in the second rear panel,
wherein, in a state where the second front panel and the second rear panel are located at the first position, a front end portion of the first electronic module is inserted in the second front opening and a front end portion of the second electronic module is inserted in the second rear opening, and
wherein, in a state where the second front panel and the second rear panel are located at the second position, a rear end portion of the first electronic module is inserted in the second front opening and the front end portion of the second electronic module is inserted in the second rear opening.

5. The module mounting device according to claim 3, wherein the front end portion of the second electronic module is attached to the second rear panel.

6. The module mounting device according to claim 4, wherein the second panel further includes a rotatable gear, wherein the second front panel includes a first teeth portion that is engageable with the gear and that is formed along a direction coupling the first side and a second side in a direction opposite to the first side, wherein the second rear panel includes a second teeth portion that is engageable with the gear and that is formed along the direction coupling the first side and the second side, and wherein the second rear panel is shifted to the first side with a rotation of the gear when the second front panel is shifted to the second side.

7. The module mounting device according to claim 1, wherein, in a state where a rear end of the first electronic module is shifted to the second side and a front end of the second electronic module is shifted to the first side, a rear end surface of the first electronic module and a front end surface of the second electronic module include an overlapping area in front view.

8. The module mounting device according to claim 4, wherein the second front openings are two openings in which the first electronic module and the second electronic module are insertable, respectively.

9. The module mounting device according to claim 4, wherein the second rear openings are two openings in which the first electronic module and the second electronic module are insertable, respectively.

10. The module mounting device according to claim 1, further comprising:
   a joint member configured to join the second panel and the third panel to each other,
   wherein the housing includes a guide rail that guides the joint member, and
   wherein, with the joint member guided along the guide rail, the second panel and the third panel are movable in a direction coupling the first panel and the third panel.

11. The module mounting device according to claim 1, wherein the third panel includes third openings in which the first electronic module and the second electronic module are insertable.

12. The module mounting device according to claim 11, wherein
   the third openings includes two openings in which the first electronic module and the second electronic module are insertable, respectively.

13. An information processing apparatus comprising:
   a first electronic module;
   a second electronic module; and
   a module mounting device over which the first electronic module and the second electronic module are mounted, and configured to include:
   a housing in which the first electronic module and the second electronic module are housed and which includes a front end and a rear end,
   a first panel that is provided over a front end side of the housing and that includes first openings in which the first electronic module and the second electronic module are insertable, a front end portion of the first electronic module being attached to the first panel while being inserted in a first opening of the first openings,
   a second panel that is provided behind the first panel, that includes second openings in which the first electronic module and the second electronic module are insertable, and that is movable between a first position behind the first panel and a second position behind the first position, the front end portion of the first electronic module and a front end portion of the second electronic module being inserted in the second openings in a state where the second panel is located at the first position, the front end portion of the second electronic module being inserted in a second opening of the second openings in a state where the second panel is located at the second position, and
   a third panel that is provided behind the second panel and that is movable between a third position behind the first position and a fourth position behind the third position,
   wherein one of the front end portion and a rear end portion of the second electronic module is attached to one of the second panel and the third panel, respectively, and
   wherein, in a state where the second panel is located at the second position and the third panel is located at the fourth position, the second panel is allowed to be shifted to a first side that is one direction in one of an up-down direction and a right-left direction.

\* \* \* \* \*